United States Patent
Hirshberg

(10) Patent No.: US 10,251,234 B2
(45) Date of Patent: Apr. 2, 2019

(54) THERMOELECTRIC THERMAL MANAGEMENT SYSTEM

(71) Applicant: David Hirshberg, Haifa (IL)

(72) Inventor: David Hirshberg, Haifa (IL)

( * ) Notice: Subject to any disclaimer, the term of this patent is extended or adjusted under 35 U.S.C. 154(b) by 224 days.

(21) Appl. No.: 15/191,590

(22) Filed: Jun. 24, 2016

(65) Prior Publication Data

US 2017/0370625 A1    Dec. 28, 2017

(51) Int. Cl.
*H05B 33/00* (2006.01)
*H05B 33/08* (2006.01)
*H01L 35/30* (2006.01)
*H05B 37/00* (2006.01)

(52) U.S. Cl.
CPC ......... *H05B 33/0872* (2013.01); *H01L 35/30* (2013.01); *H05B 37/00* (2013.01)

(58) Field of Classification Search
CPC ............................ H01L 35/30; H05B 33/0872
USPC ............................................................. 307/21
See application file for complete search history.

(56) References Cited

U.S. PATENT DOCUMENTS

| | | | |
|---|---|---|---|
| 2,519,241 A | 8/1950 | Findley | |
| 7,599,413 B2 * | 10/2009 | Luo | H01S 3/10092 372/32 |
| 7,743,614 B2 | 6/2010 | Goenka et al. | |
| 8,497,515 B1 * | 7/2013 | Sagal | H01L 33/645 257/724 |
| 2005/0076944 A1 * | 4/2005 | Kanatzidis | H01L 35/16 136/239 |
| 2005/0155642 A1 * | 7/2005 | Chen | H01L 35/00 136/252 |
| 2007/0107764 A1 * | 5/2007 | Kanatzidis | H01L 35/14 136/205 |
| 2010/0047954 A1 * | 2/2010 | Su | B26F 3/002 438/61 |
| 2010/0207573 A1 * | 8/2010 | Mo | F21S 9/04 320/101 |
| 2011/0155200 A1 * | 6/2011 | Simka | H01L 35/30 136/205 |
| 2011/0234107 A1 * | 9/2011 | Simon | H01L 35/00 315/176 |
| 2012/0204577 A1 * | 8/2012 | Ludwig | F25B 21/04 62/3.3 |
| 2014/0260329 A1 | 9/2014 | Flora et al. | |
| 2014/0305480 A1 | 10/2014 | Brandenburg et al. | |
| 2015/0179543 A1 | 1/2015 | Tan et al. | |
| 2015/0033764 A1 | 2/2015 | Gurevich et al. | |

(Continued)

OTHER PUBLICATIONS

Min G, Rowe DM (2007) Conditions for observing the thermo-electro-photo cooling effect. IET Sci Meas Technol 1(6):329 (Year: 2007).*

*Primary Examiner* — Ryan Jager

(57) ABSTRACT

A thermal management system for an object comprising: one or more thermoelectric elements, one or more light emitting sources, electricity transport medium; electrical energy storage, and a controller. Heat energy that is generated or absorbed by the object is converted by said thermoelectric element to electrical energy. This energy is transferred to light emitting source to emit the energy to the environment or delivered to the electrical energy storage or back to the thermoelectric elements using the electricity transport medium and the controller to achieve the thermal goal of the thermal management system.

29 Claims, 12 Drawing Sheets

(56) References Cited

U.S. PATENT DOCUMENTS

2015/0288187 A1* 10/2015 Poitrast .................. H01L 35/32
　　　　　　　　　　　　　　　　　　　　　　　　 700/295
2017/0327867 A1* 11/2017 Dohale ................ C12Q 1/6806

* cited by examiner

THERMOELECTRIC THERMAL MANAGEMENT SYSTEM

FIELD AND BACKGROUND OF THE INVENTION

The present invention, in some embodiments thereof, relates to a thermal management of an object and, more particularly, but not exclusively, to a thermal management that incorporated thermoelectric elements.

Thermal management of an object is changing the temperature profile of an object. The change may be globally over the object or locally over part of the object and in general may be heating or cooling or both. Cooling or heating of an object may be done in various ways. The present invention is focus on cooling or heating using thermoelectric elements, i.e. elements that are using the thermoelectric effect.

The thermoelectric effect is the ability to convert heat flow energy directly to electricity. It was discovered by a Germen physicist, Seebeck, in 1821. The reverse effect on the same device, i.e., use of an electrical energy for heat pumping (enable heating but more important also enable cooling of an object) was discovered by a French physicist, Peltier, in 1834. This two reversible energy conversion operations are performed by generating electrical current by the thermoelectric device or driving electrical current to the thermoelectric device respectively. The thermoelectric basic element is constructed, similarly to a diode, from a pair of p-doped and n-doped semiconductors materials. The device is usually build from an array of pairs of n-type and p-type pillars. The pillars reside between two planes. The thermoelectric device is solid and withstand wide range of temperatures. The energy conversion do not involve any moving parts.

Thermoelectric conversion was known to be less efficient than other techniques in the past, but a major progress in recent years both in materials science and device construction increased the efficiency as well as increased the operation temperature. New constructions of material semiconductors based on quantum mechanics principles such as quantum wells and quantum dots further increases the conversion efficiency.

The technology is used today in straight forward heat harvesting or cooling applications. Plain harvesting of heat to electrical energy is thought for example by U.S. Pat. No. 2,519,241 filed on Jul. 5, 1946. Conversion of gas chemical energy to electricity using a gas burner that heat a hot plate that is in contact with a thermoelectric device first plane and a cooling heat sink connected to thermoelectric device second plane is used today as local electricity supply in gas pipe infrastructures. Other applications such as vehicle battery charger from engines exhaust gases (e.g., U.S. patent application Ser. No. 13/861,787 filed on Apr. 12, 2013) or even a cellphone charger from campfires heat are currently in use.

There are also new emerging cooling application such as air condition systems (e.g., U.S. patent application Ser. No. 14/380,937 filed on Feb. 26, 2013), wine callers, IC, e.g. CPU coolers (e.g., U.S. patent application Ser. No. 14/138,593 filed on Dec. 23, 2013) and a compact USB device for beverage can coolers (U.S. patent application Ser. No. 14/202,939 filed on Mar. 10, 2014).

A more complex thermal management system for both heating and cooling for vehicles with a thermoelectric module deployed between the engine cooling system and passenger compartment HVAC system is described in U.S. Pat. No. 7,743,614 issued on Jun. 29, 2010.

All the above mentioned applications are heat to electricity converters or electricity to heat pumping. New ways for using thermoelectric technology integrated with additional elements in a more efficient and intelligent ways, in order to provide new applications, is being taught in the present invention.

SUMMARY OF THE INVENTION

The present invention presents a thermal management system of an object that incorporated one or more thermoelectric elements. The invention teaches using the thermoelectric elements in all possible thermoelectric elements modes of operations including as an electricity generator (electricity generation mode), electricity driven heat pumping (heat pumping mode), a heat flow blocker (heat flow blocking mode), and heat flow enabler (heat flow transferring mode) and integrating to the thermal management system variety of electrical sources and drains using a electricity transport medium and a controller to achieve new goals for thermal management system of an object.

According to an aspect of some embodiments of the present invention there is provided a thermal management system for an object comprising: one or more thermoelectric elements; and one or more light emitting sources, wherein a portion of the heat energy that is generated or absorbed by the object is converted by the thermoelectric elements to electrical energy, and the electrical energy is transferred to the light emitting sources which converts the electrical energy to light energy and emits the light energy to the environment.

According to some embodiments of the invention, the thermal management system comprising a plurality of thermoelectric elements.

According to some embodiments of the invention, the thermal management system comprising a plurality of light emitting sources.

According to some embodiments of the invention, the thermal management system further comprises an electricity transport medium that transfer the energy from the thermoelectric elements to the light emitting sources.

According to some embodiments of the invention, the electricity transport medium comprises electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

According to some embodiments of the invention, the transfer of electrical energy is controlled by a controller.

According to some embodiments of the invention, the controller controls the routing of energy between the thermoelectric elements and the light emitting sources.

According to some embodiments of the invention, the thermal management system further comprises electrical energy storage, wherein a portion of energy generated by the thermoelectric elements is transferred to the electrical energy storage and wherein a portion of the energy stored in the electrical energy storage is transferred to the light emitting sources.

According to some embodiments of the invention, the electrical energy storage comprises one or more of or any combination of (1) a battery, (2) a capacitor, and (3) a super capacitor.

According to some embodiments of the invention, a minimal level of energy is stored in the electrical energy storage before electrical energy is transferred to the light emitting sources.

According to some embodiments of the invention, the thermal management system further comprises electrical energy storage, wherein a portion of energy generated by some of the thermoelectric elements that are working in an electricity generation mode is transferred to the electrical energy storage and wherein a portion of the energy stored in the electrical energy storage is transferred to some other thermoelectric elements that are working in a heat pumping mode.

According to some embodiments of the invention, the thermal management system is implemented in a fastening element of the object.

According to some embodiments of the invention, the fastening element is a screw.

According to some embodiments of the invention, the object is a cutting tool insert.

According to some embodiments of the invention, the thermal management system is implemented in one of or any combination of (1) the cutting tool insert, (2) a seat of the cutting tool insert, (3) a tool holder of the cutting tool insert, and (4) a locking element of the cutting tool insert.

According to some embodiments of the invention, the object is an injection mold.

According to some embodiments of the invention, the object is a combustion engine.

According to some embodiments of the invention, the light emitting source is a light emitting diode or a semiconductor laser.

According to some embodiments of the invention, the thermal management system further comprises one or more sensors, wherein the transfer of energy is controlled conditioned upon the reading of the sensors.

According to some embodiments of the invention, the light emitting source is sending an information by modulating the emitted light.

According to some embodiments of the invention, the information is a temperature measurement taken from a location inside or on the surface of the object.

According to some embodiments of the invention, the wavelength of the light emitted by the light emitting source is selected to provide an illusion that the object is in a different temperature than the object real temperature.

According to some embodiments of the invention, the controller controls the emission of light by the light emitting source to emit light only in a portion of the time.

According to some embodiments of the invention, the controller controls the mode of operation of the thermoelectric elements and wherein each thermoelectric element in any portion of time is configured to be in one of an electricity generation mode, a heat pumping mode, a heat flow blocking mode or a heat flow transferring mode.

According to some embodiments of the invention, some of the thermoelectric elements are configured to be in an electricity generation mode and some others thermoelectric elements are configured to be in a heat pumping mode, and wherein a portion of the electrical energy generated by the thermoelectric elements in the electricity generation mode is transferred to the thermoelectric elements in the heat pumping mode.

According to some embodiments of the invention, the thermal management system further comprises one of or any combination of (1) an electrical energy storage, (2) an electricity transport medium, (3) a sensor, (4) an electric heater, (5) a light convertor, (6) an electrical power inlet, and (7) an electrical power outlet.

According to some embodiments of the invention, the electric heater is a resistor.

According to some embodiments of the invention, the light convertor is a solar cell.

According to some embodiments of the invention, the electrical power inlet is connected to the electrical grid.

According to an aspect of some embodiments of the present invention there is provided an apparatus comprising the thermal management system described above.

According to an aspect of some embodiments of the present invention there is provided a method for thermal management of an object comprising: generating electrical energy from heat energy that is generated or absorbed by the object using one or more thermoelectric elements; transferring the generated electrical energy to one or more light emitting sources; and emitting light energy by the one or more light emitting sources.

According to some embodiments of the invention, the transferring the electricity energy is performed by electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

According to some embodiments of the invention, the transferring of electrical energy is controlled by a controller.

According to some embodiments of the invention, the controller controls the routing of energy between the thermoelectric elements and the light emitting sources.

According to some embodiments of the invention, the method further comprises a step of storing electrical energy, wherein a portion of the energy generated by the thermoelectric elements is transferred to the electrical energy storage and a step of supplying electrical energy wherein a portion of the stored electrical energy is transferred to the light emitting sources.

According to some embodiments of the invention, the step of storing of electrical energy is performed by one or more of or any combination of (1) a battery, (2) a capacitor, and (3) a super capacitor.

According to some embodiments of the invention, the step of supplying electrical energy is performed only after a minimal level of energy is being stored.

According to some embodiments of the invention, the method further comprises the step of storing of electrical energy, wherein a portion of energy generated generating electrical energy by some of the thermoelectric elements that are working in an electricity generation mode is stored in a storing electrical energy step and the energy stored is transferred to some other thermoelectric elements that are working in a heat pumping mode.

According to some embodiments of the invention, the object is a cutting tool insert.

According to some embodiments of the invention, the object is an injection mold.

According to some embodiments of the invention, the object is a combustion engine.

According to some embodiments of the invention, the light emitting source is a light emitting diode or a semiconductor laser.

According to some embodiments of the invention, the transferring of energy step is controlled conditioned upon a reading from sensors.

According to some embodiments of the invention, the emitted light is modulated by an information.

According to some embodiments of the invention, the information is a temperature measurement taken from a location inside or on the surface of the object.

According to some embodiments of the invention, the wavelength of the emitted light is selected to provide an illusion that the object is in a different temperature than the object real temperature.

According to some embodiments of the invention, the controller controls the mode of operation of the thermoelectric elements and wherein each thermoelectric element in any portion of time is configured to be in one of an electricity generation mode, a heat pumping mode, a heat flow blocking mode or a heat flow transferring mode.

According to an aspect of some embodiments of the present invention there is provided a thermal management system for an object comprising: one or more thermoelectric elements; and an electrical energy storage, wherein some heat energy that is generated or absorbed by the object is converted by the thermoelectric elements to electrical energy which is stored by the electrical energy storage and wherein the electrical energy that is stored in the electrical energy storage is used to pump heat energy into the object, out from the object or inside the object by transfer the electrical energy from the electrical energy storage to the thermoelectric elements.

According to some embodiments of the invention, at least one thermoelectric element is generating electrical energy which is delivered to the electrical energy storage in a portion of the time and wherein the delivered energy is taken out from electrical energy storage in a different portion of the time to supply electrical energy to the at least one thermoelectric element while the element is configured to operate in heat pumping mode.

According to some embodiments of the invention, the electrical energy storage comprises from one or more of or any combination of (1) a battery, (2) a capacitor, and (3) a super capacitor.

According to some embodiments of the invention, the thermal management system further comprises an electricity transport medium that transfer the energy from the thermoelectric elements to the electrical energy storage.

According to some embodiments of the invention, the electricity transport medium comprises electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

According to some embodiments of the invention, the thermal management system further comprises one or more light emitting sources.

According to some embodiments of the invention, the transfer of energy is controlled by a controller.

According to some embodiments of the invention, the thermal management system further comprises one of or any combination of (1) a light emitting source, (2) an electricity transport medium, (3) a sensor, (4) an electric heater, (5) a light convertor, (6) an electrical power inlet, and (7) an electrical power outlet.

According to an aspect of some embodiments of the present invention there is provided an apparatus comprising the thermal management system described hereinabove.

According to an aspect of some embodiments of the present invention there is provided a thermal management system for an object comprising: one or more thermoelectric elements; and an electrical energy storage, wherein some heat energy that is generated or absorbed by the object is converted by the thermoelectric elements to electrical energy which is stored by the electrical energy storage, and wherein the electrical energy that is stored in the electrical energy storage is used to pump heat energy into the object, out from the object or inside the object by transfer the electrical energy from the electrical energy storage to the thermoelectric elements.

According to some embodiments of the invention, at least one thermoelectric element is generating electrical energy which is delivered to the electrical energy storage in a portion of the time and wherein the delivered energy is taken out from electrical energy storage in a different portion of the time to supply electrical energy to the at least one thermoelectric element while the element is configured to operate in heat pumping mode.

According to some embodiments of the invention, the electrical energy storage comprises from one or more of or any combination of (1) a battery, (2) a capacitor, and (3) a super capacitor.

According to some embodiments of the invention, the thermal management system further comprises an electricity transport medium that transfer the energy from the thermoelectric elements to the electrical energy storage.

According to some embodiments of the invention, the electricity transport medium comprises electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

According to some embodiments of the invention, the thermal management system further comprises one or more light emitting sources.

According to some embodiments of the invention, the transfer of energy is controlled by a controller.

According to some embodiments of the invention, the thermal management system further comprises one of or any combination of (1) a light emitting source, (2) an electricity transport medium, (3) a sensor, (4) an electric heater, (5) a light convertor, (6) an electrical power inlet, and (7) an electrical power outlet.

According to an aspect of some embodiments of the present invention there is provided an apparatus comprising the thermal management system described hereinabove.

According to an aspect of some embodiments of the present invention there is provided a capsule comprising: a top surface; a bottom surface; a case in-between the top surface and the bottom surface; one or more thermoelectric elements; and one or more light emitting sources, wherein the capsule is designed to stably float over a fluid in a way that the top surface is located over the fluid and the bottom surface is located under the fluid and using the difference between the temperature of the top surface and the bottom surface the thermoelectric elements is generating electrical energy and the electrical energy is transferred to the light emitting sources which convert the electrical energy to light energy and emits the light energy out of the capsule.

According to an aspect of some embodiments of the present invention there is provided a thermal management system for an object comprising a plurality of the above capsules spread over fluid areas of an object.

According to an aspect of some embodiments of the present invention there is provided a global warming prevention method comprising: spreading the above mentioned capsules over water reservoir of planet Earth; converting a temperature difference between the water and air to electrical energy by the capsules; emitting by the capsules light in a wavelength that penetrate the atmosphere.

According to an aspect of some embodiments of the present invention there is provided a thermal management system for an object comprising: a plurality of thermoelectric elements; and electricity transport medium, wherein some heat energy is converted by some of the thermoelectric elements to electricity which is transferred to some other of the thermoelectric elements by the electricity transport medium in order to accomplish a thermal distribution over the object.

According to some embodiments of the invention, the thermal management system further comprises one of or any combination of (1) an electrical energy storage, (2) a light emitting source, (3) a sensor, (4) an electric heater, (5) a light convertor, (6) an electrical power inlet, and (7) an electrical power outlet.

According to some embodiments of the invention, the electricity transport medium comprises electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

According to an aspect of some embodiments of the present invention there is provided an apparatus comprising the thermal management system described hereinabove.

According to an aspect of some embodiments of the present invention there is provided an integrated circuit for thermal management system comprising a semiconductor die; the die circuitry comprises: one or more thermoelectric element drivers; and one or more electrical energy sinks, wherein the one or more thermoelectric element drivers is configured to receive electrical energy from thermoelectric elements, and to transfer the electrical energy to the one or more electrical energy sinks.

According to some embodiments of the invention, the thermoelectric element drivers controls the mode of operation of the thermoelectric elements and wherein each thermoelectric element in any portion of time is configured to be in one of an electricity generation mode, a heat pumping mode, a heat flow blocking mode or a heat flow transferring mode.

According to some embodiments of the invention, the thermoelectric element drivers comprises one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

According to an aspect of some embodiments of the present invention there is provided an integrated circuit for thermal management system comprising a semiconductor die; the die circuitry comprises: a controller; one or more thermoelectric element drivers; and one or more electrical energy sinks drivers, one or more electrical energy sources drivers, one or more electrical energy storage drivers, an energy transfer backbone; wherein the one or more thermoelectric element drivers is configured to set each thermoelectric element mode, the one or more electrical energy sinks supply energy to a electrical sink, the one or more electrical energy sources drivers drain electrical energy from electrical source, one or more electrical energy storage drivers sink or drain electrical energy from electrical energy storage, and the energy transfer backbone can transfer electrical energy between all the thermoelectric elements, the electrical energy sinks, the electrical energy sources, and the electrical energy storages that are connected to the die and wherein the controller is dynamically set the energy flow between all sinks and drains connected to the energy transfer backbone.

According to an aspect of some embodiments of the present invention there is provided a thermal management system for an object comprising: one or more thermoelectric elements; and one or more light convertors, wherein some light energy that is absorbed by the light convertors is converted to electrical energy that is transferred to the thermoelectric element.

According to some embodiments of the invention, the thermal management system further comprises one of or any combination of (1) an electricity transport medium, (2) an electrical energy storage, (3) a light emitting source, (4) a sensor, (5) an electric heater, (6) an electrical power inlet, and (7) an electrical power outlet.

According to some embodiments of the invention, the thermal management system further comprises an electricity transport medium.

According to some embodiments of the invention, the electricity transport medium comprises electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As to software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a processor or a micro controller. Optionally, the processor includes a volatile memory for storing instructions and/or data and/or a non-volatile storage, for example, a flash memory and/or removable media, for storing instructions and/or data. Optionally, a network connection is provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
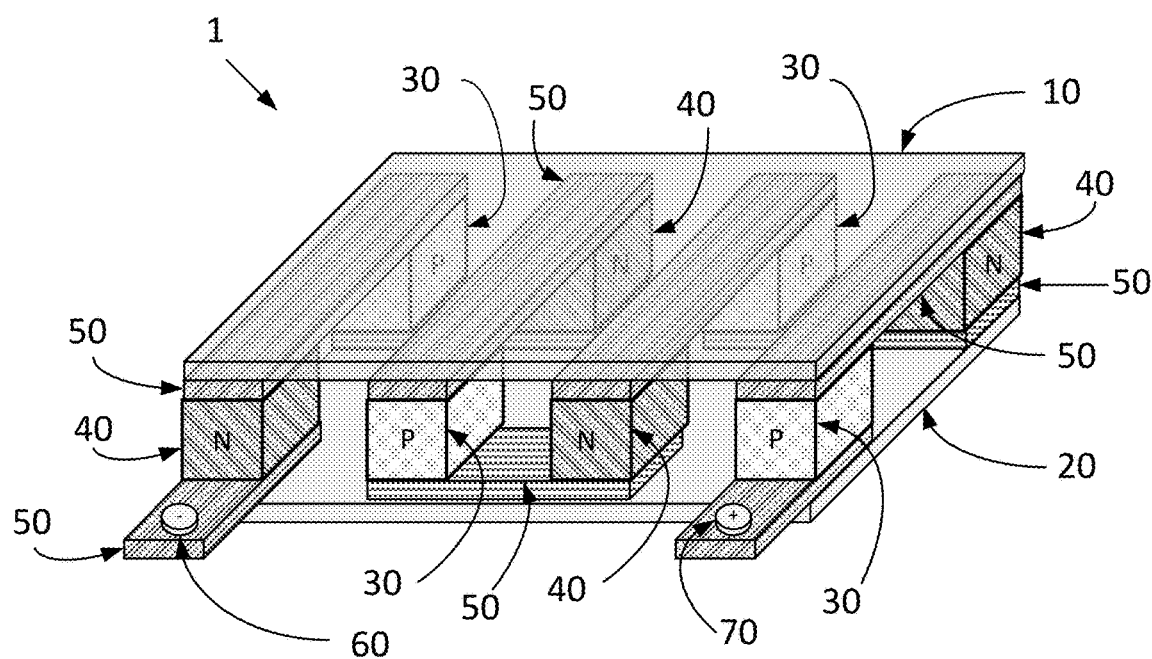
FIG. 1 is an isometric view of an exemplary thermoelectric element in accordance with the present invention.

The present invention, in some embodiments thereof, relates to a thermal management of an object and, more particularly, but not exclusively, to a thermal management that incorporating thermoelectric elements.

Thermal management of an object is changing the temperature distribution profile of an object. The change may be globally over the object or locally over part of the object and in general may be heating or cooling or both. Cooling or heating of an object may be done in various ways. The present invention is focus on cooling or heating using thermoelectric elements, i.e. elements that are using thermoelectric effect.

The thermoelectric effect is a direct convert of heat energy to electricity. It was discovered by a Germen Physicist, Seebeck, in 1821. The reverse effect on the same device, which is the use of an electrical energy for heat transfer is mainly used today for cooling. Cooling of an object by thermoelectric elements was discovered by a French Physicist, Peltier, in 1834. This two reverse energy conversion operations are performed by generating or driving an electrical current to or from the thermoelectric element, which is constructed from p-doped and n-doped semiconductors materials. The thermoelectric element is typically build from an array of pairs of n-type and p-type pillars that reside between two planes or surfaces. The size of the thermoelectric element can be as small as less than a few square micrometers or as big as needed, e.g., one square meter, depended on the application. The thermoelectric element can also be shaped in various geometries. A thermoelectric element is a solid element and withstand wide range of temperatures and pressures. One important feature of the thermoelectric element is that the energy conversion do not involve any moving parts and it can be implemented in wide range of environmental conditions.

Thermoelectric conversion was known to be less efficient heat energy conversion than other techniques in the past, but a major progress in recent years, both in materials science and device construction, increased the efficiency as well as increased the effective temperature range. Currently there are thermoelectric elements that can work form around 100° K to more than 1300° K. New semiconductors material constructions based on quantum mechanics concepts, such as quantum wells, quantum wires and quantum dots, are further increasing the conversion efficiency.

As used herein, the term thermoelectric element means a component with an electric port comprising two conducting contacts and two heat transfer surfaces. The surfaces may be flat or curvy. Thermoelectric element may be used as an electric generator that convert part of the heat energy flow from one surface to the other surface (termed hereinafter, electricity generation mode) or an heat pump that force, by using electrical energy, heat energy flow from one surface to the other surface (termed hereinafter, heat pumping mode). In conditions where there is a natural thermal flow a thermoelectric element may work in a superposition of electricity generation mode and heat pumping mode.

As used herein, the term object means any article containing one or more connected parts such as an engine head, a mold, a cutting knife, a saw, a building roof, a screw, a seat, a garment, a motor, a tool or instrument, a star or any other object which a temperature control or thermal management is desired to be applied to the object.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

An example of a thermoelectric element is shown in FIG. 1. The thermoelectric element 1 comprising an electric port with two electric contacts, a P contact 70 and an N contact 60, and one or more pairs of P-type semiconductor pillar 30 and N-type semiconductor pillar 40. Pillars (30, 40) connected in series using conductive elements 50. The plurality of pillars (30, 40) surrounded with two heat transfer surfaces: a first surface 10 and a second surface 20. The first and second surfaces may be flat or curvy. Alternatively, the surfaces (10, 20) are integral part of an object that the thermoelectric element 1 is embedded within. The number of pillars may be as low as two, i.e. one pair, or can be thousands or millions or even more. The pillars can be in any size and the shape of the pillars can be in any three dimension shape.

Variety of semiconductor materials are used to construct the pillars. Materials such as PbTe, SiGe, $Sb_2Te_3$, PbTeSe, TAGS, $CeFe_4Sb_{12}$, $Yb_{14}MnSb_{11}$, $Bi_2Te_3$, $Bi_2TeSe_2$, $CoSb_3$, $La_3Te_4$, MgAgSb, $Cu_2Se$, Graphene and many others material composites are used. Large range of doping concentrations including variable doping are used as well. The material differs in their conversion efficiency and working temperature. Nano structures that harness quantum physics effects such as quantum walls, quantum wires and quantum dots are used to further increase the conversion efficiency.

Variety of pillars structures may be used. Pillars with different materials or different doping concentrations stack on each other and thermoelectric elements with several floors of pillars are used as well.

The density of the pillars may be dense or sparse. The volume between the pillars is preferably both electric and heat isolative. Vacuum, air or any other gas, liquid or solid isolative material may be used. The electric conductive connection between adjacent pillars is done only by conductive elements 50. Each conductive elements 50 connects two adjacent opposite doped pillars. Conductive elements 50 can be in any conductive material, including metals, semiconductors, conducting ceramics or polymers or the like. Conductive elements 50 can be in any shape such as bar, wire or the like.

Thermoelectric element 1 works in two modes: electricity generation mode and heat pumping mode. In an electricity generation mode, first surface 10 is hotter than second surface 20 and the thermoelectric element convert part of the heat energy naturally tending to transfer from first surface 10 to second surface 20 to electrical energy. The electrical energy is delivered out from the thermoelectric element 1 using a port comprising two conductive contacts, P contact 70 and N contact 60. When the port is open, i.e. no electric load connected, a voltage potential will exists between the port contacts. When an electric load is connected an electric current flows and electrical energy is transferred from thermoelectric element 1 to the electric load. To achieve maximum generated power the load resistance must be matched. However, in thermal management application unmatched load that partially block the heat transfer between surfaces 10, 20 or increase the transfer of heat between surfaces 10, 20 in exchange of degraded generated electrical power is used and desired in many situations.

In heat pumping mode, an electrical energy is provided to thermoelectric element 1 through thermoelectric element port. The electrical energy is pumping heat energy from the first surface 10 and transfer this energy to the second surface 20. This heat energy flow is occurs even in the case where thermodynamically natural heat flow could not occur such as in the case where first surface 10 is cooler than second surface 20. This mode is called heat pumping since thermoelectric element 1 is "pumping" heat from the "lower" heat potential to the "higher" heat potential. Such an action need an energy supply. The energy supply is provided by the electrical energy delivered to thermoelectric element 1 through the thermoelectric element port (60, 70). Typically, thermoelectric elements are symmetric in the sense that surface 10 and surface 20 could change function, i.e., surface 10 might be the cold side or the hot side and surface 20 could be the hot side or the cold side respectively, and the only change it incur is reverse polarity of the current in thermoelectric element port (60, 70). Alternatively, thermoelectric elements in the present invention are not symmetric and there are different heat electricity transfer function when flipping the surface sides.

In the use of thermoelectric elements in heat pumping mode, it is commonly assumed that there are essentially no significant temperature difference between surfaces 10, 20 and the heat transfer due to heat pumping mode could be transferred either from surface 10 to surface 20 or from surface 20 to surface 10 depending on the polarity of the supplied current to thermoelectric element 1. However, in the context of the present invention heat pumping mode is also related to the case were significant temperature difference between surfaces 10, 20 do exist but the amount of supplied electrical energy to the thermoelectric element surpass the amount of energy generated by the thermoelectric element. If the temperature difference is large, the heat pumping mode may just block some of the heat flow that would otherwise naturally flow to the cold side. Similarly, in the context of the present invention generating mode is also related to the case were significant electrical energy is supplied to the thermoelectric element however the amount of supplied electrical energy to the thermoelectric element fall behind the amount of energy generated by the thermoelectric element. It can be thought of as a state where the thermoelectric element is in superposition of optimal electricity generation mode with less significant heat pumping mode that alter the heat transfer and electrical energy conversion ratios from the optimal generation point.

In addition to the modes of electricity generation mode and heat pumping mode, there are two other important modes that do not involve electrical energy flow to/from the thermoelectric element.

The first mode exists when the thermoelectric element port (60, 70) is disconnected. In this mode, the thermoelectric element decrease the natural heat flow through the thermoelectric element to a minimal leakage value. This mode is analogous to a switch in off (or open) state wherein the thermoelectric element block the (heat) current through the switch (i.e., the thermoelectric element). This mode is termed hereinafter "heat flow blocking mode".

The second mode exists when the thermoelectric element port (60, 70) is shortened (i.e., P contact 70 and N contact 60 are connected to each other). In this second mode, the thermoelectric element act as a good conductive channel for the heat flow between surfaces 10, 20. This mode is analogous to a switch in on (or close) state that wherein the thermoelectric element transfer the (heat) current through the switch (i.e., the thermoelectric element). This mode is termed hereinafter "heat flow transferring mode".

In exemplary embodiment of the invention, a non p-type n-type thermoelectric element technologies based on Graphene, Graphene nanotubes, metallic plates, insulating oxides, e.g., $LaAlO_3$ and $SrTiO_3$, multi-ferrous alloy, e.g., $Ni_{45}Co_5Mn_{40}Sn_{10}$, or the like are used.

Figure 2:
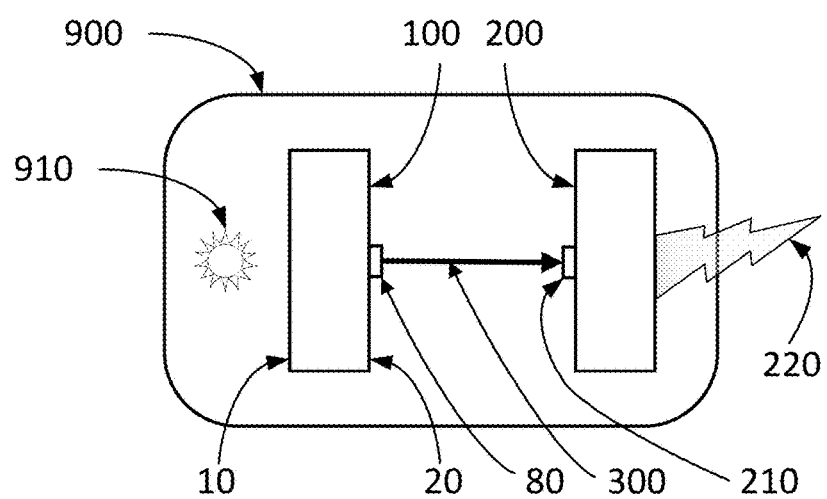
FIG. 2 is a simplified block diagram of a thermal management system in accordance with some embodiments of the present invention.

Reference is now made to FIG. 2. FIG. 2 illustrates a simplified block diagram of a thermal management system for an object 900. The object may be any article containing one or more connected parts such as an engine head, a mold, a cutting knife, a saw, a building roof, a screw, a seat, a garment, a motor, a tool or instrument, a star or any other object which a temperature control or thermal management is desired for the object.

Object 900 comprises heat source 910. Optionally, a plurality of heat sources are existing in object 900. Heat source 910 is located inside object 900. Additionally or alternatively, heat source 910 is located on the surface of object 900. Additionally or alternatively heat source 910 is located outside object 900 and part of the heat it creates is absorbed into object 900. The thermal management system of object 900 comprises thermoelectric element 100 and light emitting source 200. Part of the heat energy that is generated or absorbed by object 900 is converted by thermoelectric element 100 to electrical energy, and in turn the electrical energy is transferred to light emitting source 200 which converts the electrical energy to light energy 220 and emits light energy 220 to the environment. This process increase the ability of object 900 to release heat energy to the environment. Without the proposed intervention of the presented thermal management system, object 900 can naturally release an excessive heat using conduction, convection and radiation. Conduction is the transfer of heat energy between objects that are in physical contact. In conduction, object 900 is in contact with another object that should be cooler and the heat is transfer through the contacting surface to the cooler object. Convection is the transfer of energy between object 900 and its environment, due to fluid in motion. The fluid can be an air using natural air flow or forced air flow by fan, blower or the like. The fluid can be water or other coolant such as oil or cutting liquid for metalworking and the like. Sometimes to enhance the heat evacuation from object 900 heat sink is used. Heat sink enhance heat evacuation of object 900 by enhance both conduction, convection. Heat sink is build from a good heat conducting material that attached to the surface of object 900 to evacuate the heat into the heat sink using conduction. The side of the heat sink that is in contact with the environment is designed to have large contact area with a fluid that take the heat away from the heat sink by convection. Some drawback of heat sinks is that they are bulky, expansive and not always practical. Heat sinks also need a coolant convection system which is also bulky and expansive.

The third type of heat release is electromagnetic radiation. Any object emit electromagnetic radiation spontaneously with an intensity and spectral components obeying the well-known physical law of black body radiation. The spectrum of the black radiation changed with the temperature of the object. As the temperature gets higher the radiation shifts to shorter wavelength. In low temperature the most of the energy is emitted in the Infra-Red (IR) range of the spectrum. Black-body radiation becomes a visible glow of light if the temperature of the object is high enough. The temperature at which all solids glow a dim red is about 798 K. at 6000 K, all solids looks white. In most practical cases, i.e. in temperature lower than 1000 K, spontaneous radiation is the least efficient method of heat energy evacuation from an object due to the low conversion ratio between heat and radiation. However, radiation is the best way to evacuate heat energy, it evacuate fast, i.e., with the speed of light, it does not need a medium nor medium flow, i.e., can evacuate the energy in vacuum as well, and since most material are transparent to radiation in some wavelengths ranges, in a proper wavelength, radiation can evacuate energy from inside a solid object as well. The herein presented thermal management system provide new way, not spontaneous rather well designed and controlled way to evacuate heat energy from an object through radiation. Well designed and controlled means that one is controlling the wavelengths used, the location of emissions over the object, the intensity, the time of emission and the like.

Thermoelectric element 100 has a first surface 10 facing heat source 910 and second surface 20 facing the opposite direction. Due to the temperature difference between the surfaces, thermoelectric element 100 will generate electrical energy that will be provided in thermoelectric element port 80. The electrical energy is transferred to port 210 of light emitting source 200 using electricity transport medium 300. In the simplest case, the electricity transport medium 300 is just two electrical conductive wires. In other embodiments, described hereinafter, electricity transport medium 300 may include one conducting element and a ground plane, plurality of conductors, switches and electronic circuits such as DC to DC convertors, bridges or other circuits to optimize the energy transfer between thermoelectric element 100 and light emitting source 200. To extract the electrical energy from thermoelectric element 100 in most efficient way, the resistance of a load should be matched to the thermoelectric element 100. The resistance for optimal matching may change with thermoelectric element 100 temperature as well as other parameters. Optionally, electricity transport medium 300 circuitry is performing load matching to each thermoelectric element 100. Additionally or alternatively, this load matching is done dynamically based on real time measurements.

The electrical energy delivered to light emitting source port 210 is converted to light 220 by light emitting source 200. The light, i.e., the electromagnetic radiation or simply the radiation, is directed to leave object 900 to the environment taking part of the heat energy generated by heat source 910 away. Any kind of light emitting source may be used. In specific, solid state light emitting sources such as LEDs may be used. A broad band light emitting source or narrow single wavelength light emitting source may be used. Light emitting source 200 may be located at the surface of object 900 in such a way that the emitted light is not passing through object 900. However, light emitting source 200 may also be located inside object 900 and the wavelength of light 220 is configured to pass through object 900 (i.e., the object is transparent to the light in the emitted wavelength).

Optionally, thermoelectric element 100 and light emitting source 200 are located adjacently in such a way that electrical transport medium 300 is not needed.

The term light energy, or in short light, means any electromagnetic radiation energy with vacuum wavelength shorter than 1 millimeter and longer than 1 nanometer.

In an exemplary embodiment of the invention there is provided, a thermal management system for object 900 comprising one or more thermoelectric elements; and one or more light emitting sources. A portion of the heat energy that is generated or absorbed by object 900 is converted by thermoelectric element 100 to electrical energy, and the electrical energy is transferred to light emitting source 200 which converts the electrical energy to light energy and emits the light energy to the environment.

In yet another exemplary embodiment of the invention there is provided a method for thermal management of an object comprising: generating electrical energy from heat energy that is generated or absorbed by the object using one or more thermoelectric elements; transferring the generated electrical energy to one or more light emitting sources; and emitting light energy by the one or more light emitting sources.

The term light emitting source means any element that receive electrical energy, convert the energy to light and emit the light. An examples of light emitting sources are Light-emitting diode (LED), Organic LED, Polymer LED, AMO-LED, Quantum dot LED, laser, solid state laser, diode laser, Quantum well laser, VCSEL, fluorescent material and the like.

Figure 3:
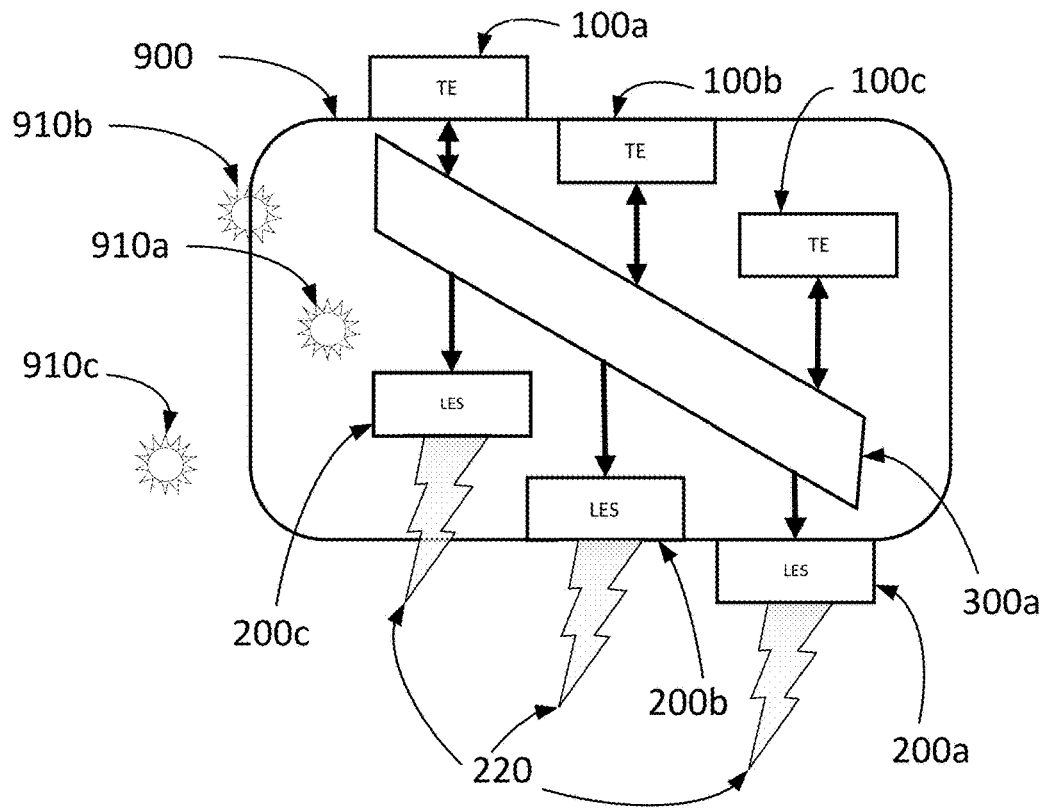
FIG. 3 is a simplified block diagram of another thermal management system in accordance with some embodiments of the present invention.

Reference is now made to FIG. 3. FIG. 3 illustrates simplified block diagram of another thermal management system of an object 900 with three heat source 910a, 910b, and 910c. The thermal management system comprises a plurality of thermoelectric elements (three thermoelectric elements 100a, 100b, and 100c are illustrated in the figure) and a plurality of light emitting sources (three light emitting sources 200a, 200b, and 200c are illustrated in the figure).

Heat source 910a is located inside object 900. An example for such a heat source is a cylinder in a combustion engine object or filled cavity in injection mold object. Heat source 910b is located on the edge of object 900. An example for such a heat source is a cutting edge of an insert in a metal tool or a disk plane in an automotive disk brake. In both of those examples, the heat is generated by a friction between the object 900 edge and the environment, i.e., the workpiece in metal cutting example and the brake pads in the brakes example. Heat source 910c is located outside object 900. An example for such a heat source is the sun shining over object 900 located outdoor, e.g., planet Earth, or a stove heating an indoor object.

Thermoelectric element 100a is located in on the boundary of object 900. One of surfaces 10 or 20 of thermoelectric element 100a is in contact with object boundary while the other surface is facing the environment. Thermoelectric element 100a port is facing object 900 Thermoelectric element 100b is located in the boundary of object 900. One of surfaces 10 or 20 of thermoelectric element 100b is a part of object boundary facing the environment while the other surface is inside object 900. Thermoelectric element 100c is located inside object 900. Both surfaces 10 or 20 of thermoelectric element 100c are inside object 900.

Light emitting sources 200a is located on the boundary of object 900. The source port is facing object 900 and the source emitting side facing the environment. Light emitting sources 200b is located in the boundary of object 900. Light emitting sources 200b emitting surface side is a part of object 900 boundary and facing the environment. Light emitting sources 200c is located inside object 900.

Electricity transport medium 300a is connected to all thermoelectric elements and light emitting sources. Electricity transport medium 300a manage the flow of electrical energy between the thermoelectric elements and light emitting sources and transfer the energy from the thermoelectric elements to the light emitting sources. The thermoelectric elements may be connected in serial or in parallel or in a mixed serial and parallel combination to combine the energy from all thermoelectric elements. Light emitting sources may be connected in serial or in parallel or a mixed serial and parallel combination to deliver and spread the electrical energy to the light emitting sources. Electrical energy generated by one thermoelectric element may also be delivered to and dissipated in another thermoelectric element active in heat pumping mode in order to cool a local region of object 900. Alternatively, one to one mapping (i.e. energy transport) from a thermoelectric element to a light emitting source is made in the electricity transport medium 300a. Other mapping such as one to many and many to one and combination of mapping may be used in the case of plurality thermoelectric elements and plurality of light emitting sources. Electricity transport medium 300a may have fix routing if a static mode of operation is desired. Alternatively, electricity transport medium 300a have architecture of switches such as matrix configuration, H-bridge configuration to change element polarity and routing in order to implement dynamic routing of the transport of electrical energy from thermoelectric elements to light emitting sources as well as between thermoelectric elements themselves. Fox example, if the object is rotating and have four light emitting sources which upon the rotation state of the object in any given time a different light emitting source has free radiation path to the environment, a dynamic routing of electricity transport medium 300a is used in such a way that in any given time the generated electrical energy will be transferred to the light emitted source that have the free radiation path. This is done by programming the switches in electricity transport medium 300a to the desired setting. Another example is dynamic scenario where each thermoelectric element see different local temperature as well as different temperature difference between the thermoelectric element surfaces. An electricity transport medium 300a with dynamic routing capabilities may route the electrical energy in such a way that the thermoelectric element facing the maximum temperature will used for cooling this area in heat pumping mode and the energy supply for the pumping will be delivered from the energy generated by all other thermoelectric element to enable maximum cooling of the highest local temperature. Other optional features of electricity transport medium 300a is presented in FIG. 7 and its accompanying description.

Figure 4:
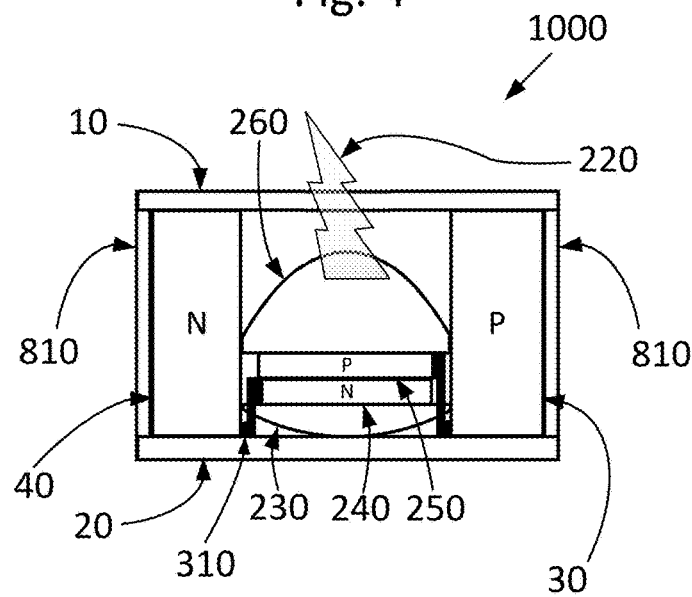
FIG. 4 is a cross-sectional view of a simple thermal management system in accordance with the present invention.

Reference is now made to FIG. 4. FIG. 4 illustrates cross-sectional view of a thermal management system 1000. Thermal management system 1000 is encapsulated in a case (or a capsule) comprising first surface 10, second surface 20 and enclosure 810. Enclosure 810 is preferably made of heat insulating materials to tunnel the heat energy flow through the thermoelectric element. The thermal management system 1000 contains pillars 30 and 40 that creates the thermoelectric elements. The thermoelectric energy is transferred through conductive elements 310 to a PN junction LED type light emitting source comprising a P layer 250 and an N layer 240. Light 220 created in the junction area optionally directed to a desired direction using a reflector 240 and a lens 260. For clarity, FIG. 4 is illustrative and not in scale and actual geometry may varies both in size and in shape. As illustrated in the figure, the semiconductor materials of the thermoelectric element and the light emitting source are different and typically are made of different semiconductor materials. Optionally, the thermoelectric element and the light emitting source are made from the same materials. The thermal management system 1000 may be manufactured as a single die in a semiconductor fabrication facility. The dimensions of the thermal management system 1000 may be as small as few micrometers. A plurality of small thermal management systems 1000 may be spread inside an object or on or near the object surface. To enhance the efficiency in the case where the instantaneous collected energy from the thermoelectric element is not sufficient to efficiently convert the electrical energy to light, a DC-to-DC convertor or charge pump or any other electronic circuit that comprises one or more electrical energy storage elements may be used to collect some of the converted thermal energy before delivering the collected energy in a proper form, i.e. voltage or current setting, to efficiently further convert the electrical energy to light by the light emitting source.

In an exemplary embodiment of the invention, a capsule comprising a top surface 10; a bottom surface 20; a case 810 in-between the top surface and the bottom surface; one or more thermoelectric elements; and one or more light emitting sources is provided. The capsule is designed to stably float over a fluid in a way that the top surface is located over the fluid and the bottom surface is located under the fluid and using the difference between the temperature of the top surface and the bottom surface the thermoelectric elements is generating electrical energy and the electrical energy is transferred to the light emitting source which converts the electrical energy to light energy 220 and emits the light energy 220 out of the capsule.

Figure 5:
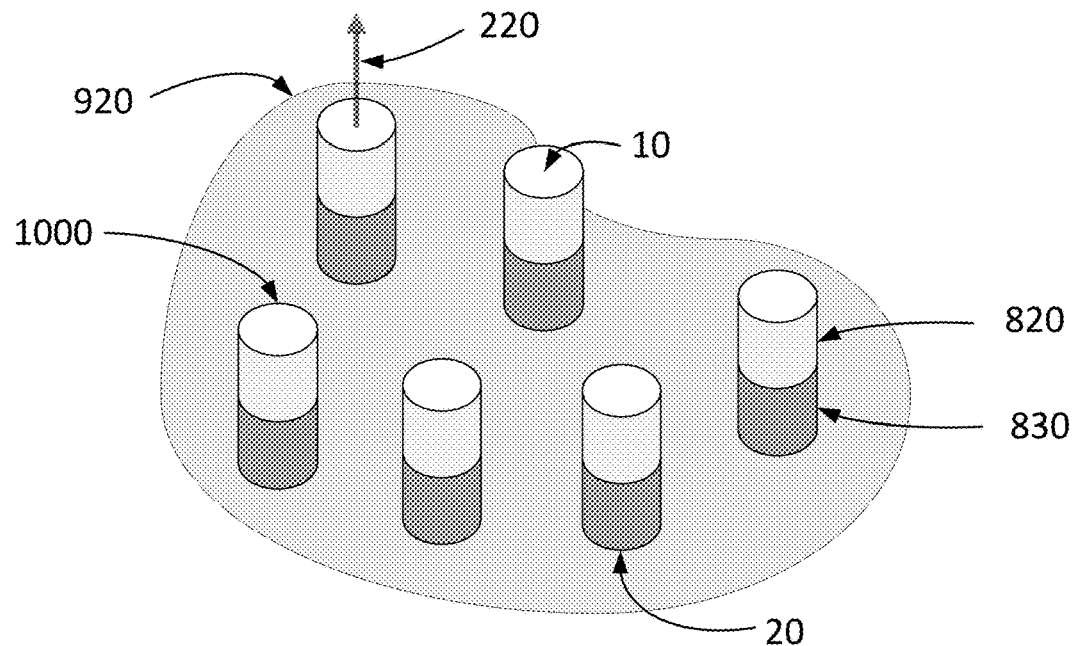
FIG. 5 is a conceptual view of exemplary application for the thermal management system shown in FIG. 4.

Reference is now made to FIG. 5. An example of an application of the thermal management system of FIG. 4 is illustrated in FIG. 5. Large amount of thermal management systems 1000 is spread in water or liquid reservoir 920 such as lakes, seas, pools, tanks and oceans. For the sake of clarity six thermal management systems 1000 are illustrated in the figure. In an exemplary embodiment of the invention the thermal management system comprising a plurality of capsules spread over fluid areas of the object.

The thermal management systems 1000 weight distribution and center of mass are designed in such a way that the thermal management systems 1000 will float with approximately half of the enclosure 820 is above the water and approximately half of the enclosure 830 is under the water. The emitted light 220 is directed to the air side.

The thermal management systems 1000 may be massively deployed on planet Earth water reservoirs, e.g., lakes, seas and oceans, in order to decrease the global warming. Air heats up and cool off faster than water so usually after sunset the water temperature is higher than the water and vice versa in the morning. Other longer term climate effects also contribute to a temperature difference between air and water on Earth. This thermal difference is converted to electrical energy and light 220 is emitted to the air by the light emitted source in a wavelength that is not reflected or absorbed by the atmosphere hence escape to space. Large scale deployment can create a substantial and sustained cooling effect while the small size and the random spread do not disturb the environment. Additionally or alternatively, thermal management systems 1000 may be spread over water reservoirs 920 such as artificial pools or tubs to control temperature for food growing applications, biological applications or chemical applications.

Alternatively, mass random deployment of thermal management systems 1000 may be spread inside or on a surface of solid object.

In an exemplary embodiment of the invention a global warming prevention method comprising: spreading capsules over water reservoir of Earth; converting a temperature difference between the water and air to electrical energy by the capsules; emitting by the capsules light in a wavelength that penetrate the atmosphere, is provided.

Figure 6:
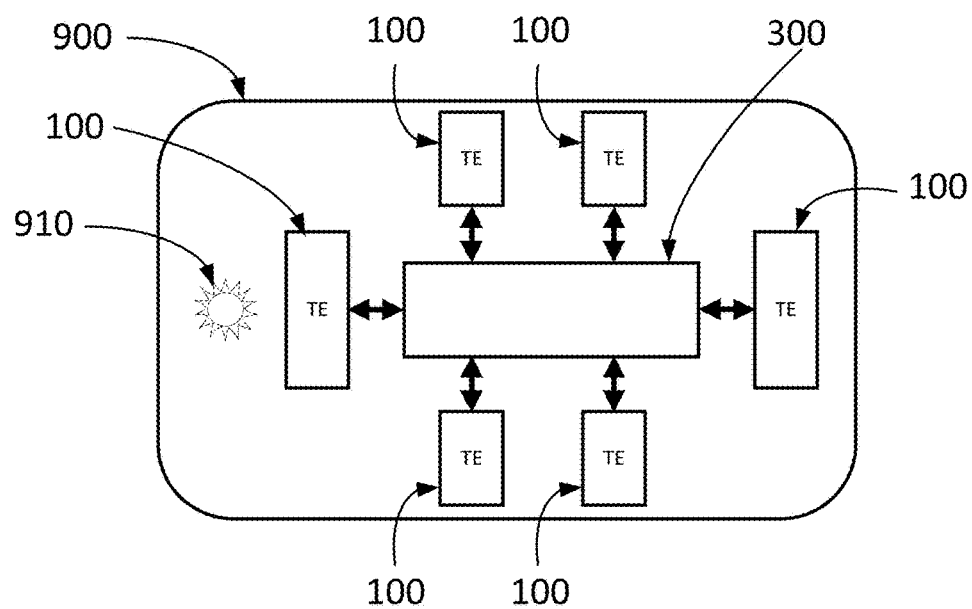
FIG. 6 is a simplified block diagram of yet another thermal management system in accordance with some embodiments of the present invention.

Reference is now made to FIG. 6. FIG. 6 illustrates simplified block diagram of yet another thermal management system for an object 900 comprising a plurality of thermoelectric elements 100 and electricity transport medium 300. For clarity, six thermoelectric elements 100 are illustrated in the figure but as small as two and as large are thousands or millions thermoelectric elements 100 may be deployed in or on object 900. Object 900 comprise heat source 910. Optionally, plurality of heat sources are existing in object 900. Heat source 910 is located inside object 900. Additionally or alternatively, heat sources are located on the surface of object 900. Additionally or alternatively heat sources are located outside object 900 and part of this heat is absorbed into object 900. The existence of heat sources creates non-uniform temperature distribution over object 900. This non-uniform temperature distribution induce temperature difference in-between thermoelectric elements 100 first and second surfaces. The temperature difference between thermoelectric 100 surfaces also refer as the temperature gradient over thermoelectric element 100.

Thermal management system takes some of the heat energy that is converted by some of thermoelectric elements 100 to electrical energy and transferred this energy to some other thermoelectric elements 100 by electricity transport medium 300 in order to force a different thermal distribution over object 900. The target thermal distribution depend on the specific application and may be, for example, as close as possible to uniform temperature distribution or a minimum temperature in a specific location or a minimum temperature in a plurality of locations or a maximum temperature in a specific location or any other desired temperature distribution. It is worth to note that not any desired temperature distribution is physically achievable, but having plurality of thermoelectric elements 100 scattered over object 900 and flexible enough electricity transport medium 300 can achieve at least a good approximation for the closest possible distribution goals. The plurality of thermoelectric elements 100 creates a mesh of heat valves and heat pumps inside object 900 that control the local flow of heat energy over object 900 while electricity transport medium 300 enables the electrical energy generated by each thermoelectric element 100 in electricity generation mode to be quickly transported globally to other locations in object 900 and then converted locally by using the thermoelectric elements 100 in heat pumping mode to create local temperature difference in object 900.

In an exemplary embodiment of the invention there is provided a thermal management system for an object 900 comprising: a plurality of thermoelectric elements 100; and electricity transport medium 300, and some heat energy is converted by some of the thermoelectric elements to electricity which is transferred to some other of the thermoelectric elements by the electricity transport medium in order to accomplish a thermal distribution over object 900.

An example for a thermal management system application is a cutting tool object. Cutting tool have a cutting edge that generate a heat due to friction with a workpiece. Due to geometry limitations, a large fin array acting as a heat sink is not possible on the cutting edge soundings but it may be available on the other side of the cutting tool. A thermal management system contains several thermoelectric elements located in proximity to the cutting edge and another large thermoelectric element located in proximity to the heat sink is one implementation option of a thermal management system to the cutting tool. The desired temperature distribution is to cool the cutting edge area as much as possible. To achieve that target, the electricity transport medium 300 will use a combination of thermoelectric elements in electricity generation mode and in heat pumping mode to maximize the transfer of heat from the cutting edge to the heat sink.

Electricity transport medium 300 may comprise switches arrangement, such as H-Bridge, to reverse the polarity of the thermoelectric elements so opposite temperature gradient can still generate positive direction electrical current flow or to reverse the polarity of the heat flow in heat pumping mode. Electricity transport medium 300 may use switches to directly connect any thermoelectric element to any other thermoelectric element or connect in serial or in parallel any subset of thermoelectric elements. The switches may be made of transistors, such as bipolar, JFET or MOSFET transistors, or electromechanical mechanical switches or the like. It is worth to note that any serial or parallel configuration of elements that are not in the same thermal condition may yield non-efficient energy convention or heat energy flow both in electricity generation mode and in heat pumping mode. To address that problem as well as decrease switches count, alternative electricity transport medium architecture is illustrated in FIG. 7.

Figure 7:
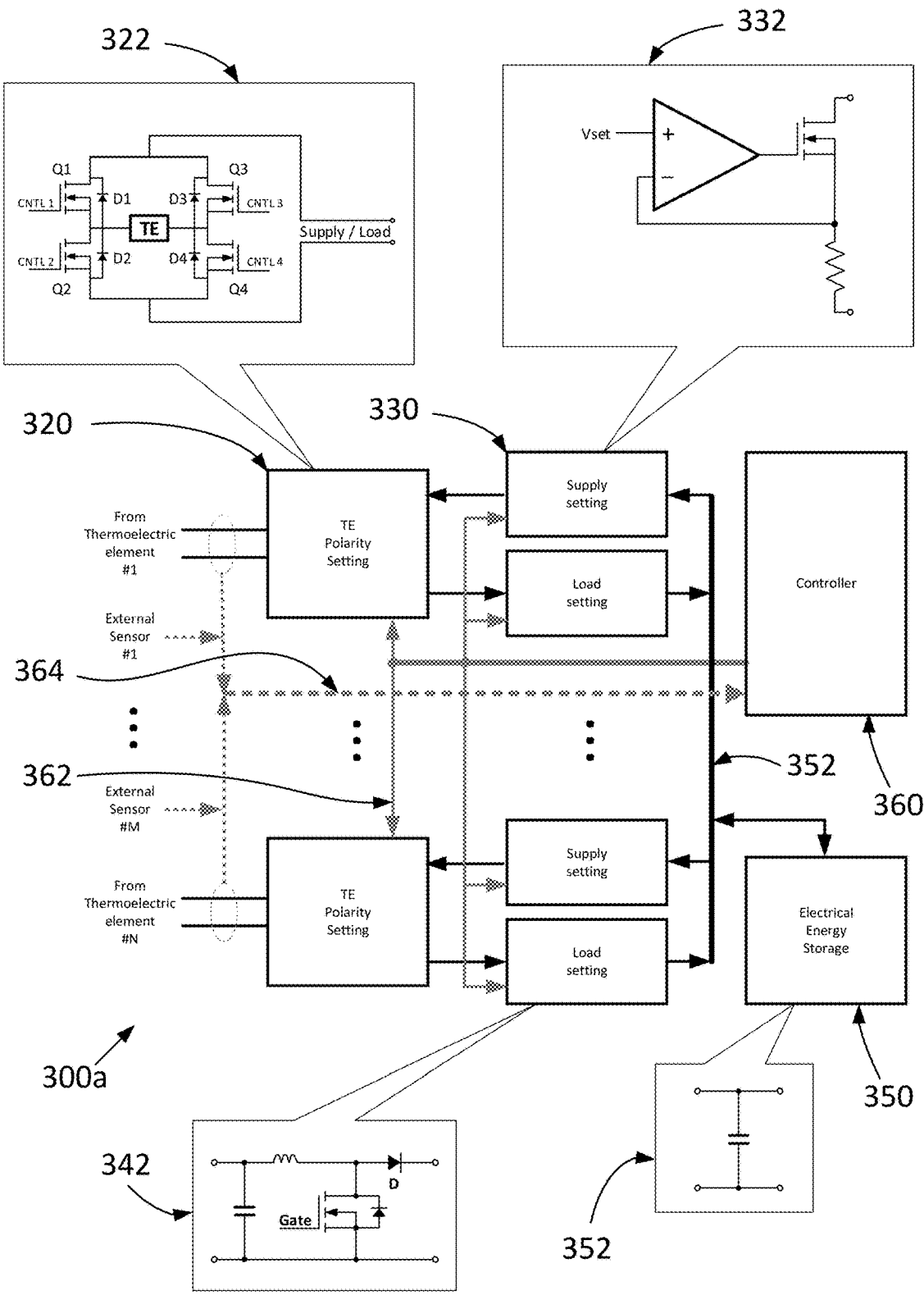
FIG. 7 is a block diagram of an exemplary architecture for an electricity transport medium in accordance with some embodiments of the present invention.

Reference is now made to FIG. 7. FIG. 7 illustrates an architecture for implementing electricity transport medium. Electricity transport medium 300a serve a plurality of thermoelectric elements. For the sake of clarity only the two wire interface of thermoelectric element No. 1 and the two wire interface of thermoelectric element No. N are drawn on the left side of the figure. Each thermoelectric element is connected to polarity setting block 320. Polarity setting block 320 controls the direction of the current supplied by the thermoelectric element in electricity generation mode or the polarity of the current supplied to the thermoelectric element, which set the direction of heat flow, in heat pumping mode. Optionally, polarity setting block 320 may disconnect the thermoelectric element port from the electricity transport medium 300a, i.e., decrease the heat flow through the thermoelectric element to minimal leakage value, i.e., set the thermoelectric element to operate in heat flow blocking mode. Optionally, polarity setting block 320 may short the contacts of the thermoelectric element port from the electricity transport medium 300a to increase the heat flow through the thermoelectric element to a maximum value without using of external energy, i.e., set the thermoelectric element to operate in heat flow transferring mode.

Each polarity setting block 320, is connected to two blocks: Supply setting block 330 and load setting block 340. Supply setting block 330 drives current (i.e., electrical energy) to the particular thermoelectric element and load setting block 340 absorbs current (i.e., electrical energy) from the particular thermoelectric element. The amount of current that is absorbed by the load setting block 340 is controlled by a controller 360. Load setting block 340 may be set to absorb current in the range from zero up to the maximal shortage current of the thermoelectric element. The maximum generated electrical energy by the thermoelectric element will be when the absorbed current is half of the maximal shortage current. In this working point the resistive load of load setting block 340 seen by the thermoelectric element is matched with the internal resistance of the thermoelectric element. This working point, which is highly desired when using thermoelectric elements as an electrical generator, is not necessarily the optimal working point for the thermal management system and controller 360 may set load setting block 340 to any other working point in the range.

Supply setting block 330 may be set to drive current in the range from zero up to the maximal current the thermoelectric element withstand. The maximum efficiency of the thermoelectric element as a heat pump is obtain approximately when the current is half of the maximal shortage current. This working point, which is highly desired when using thermoelectric elements as a cooler, is not necessarily the optimal working point for the thermal management system and controller 360 may set supply setting block 330 to any other working point in the range.

The current (or the power or the energy) from all load setting blocks 340 and all supply setting block 330 is summed together to central energy bus 352. Central energy bus 352 is connected to electrical energy storage block 350. Optionally, no energy block exists in electricity transport medium 300a. In this case, the sum of all current delivered to all supply setting blocks 330 is equal at all time to the sum of all current delivered to all load setting blocks 340. Alternatively, a small capacity electrical energy storage block 350 is deployed to overcome small instantaneous difference between the sum of all current delivered to all supply setting blocks 330 and the sum of all current delivered to all load setting blocks 340. Yet another alternative is that electrical energy storage block 350 has substantial energy capacity to provide ability for more flexible thermal management strategy where for substantially long time the overall total generated electrical energy generated by the thermoelectric elements surpass the total energy delivered to the thermoelectric elements in heat pumping mode or vice versa. More details for this strategy is described hereinafter.

Controller 360 controls the transfer of electrical energy. Controller 360 controls the instantaneous flow of electrical energy between all thermoelectric elements by setting blocks 320, 330 and 340. This is done using setting bus 362. Using setting bus 362 the polarity of each thermoelectric element and the amount of current driven or sunk from each thermoelectric element is set. The setup or the working point of the thermal management system is either predetermined or calculated by the controller based on the target temperature distribution and the current state (temperature distribution as well as additional parameters if appropriate) of the object and the thermoelectric elements. Alternatively, all setting are pre-set so no dynamic control is needed. Optionally or additionally, Controller 360 controls the routing of energy between the thermoelectric elements and the light emitting sources.

To sense the state of the managed object, controller 360 has sensing bus 364 connected to variety of sensors. Sensors may be internal sensors that measure the thermoelectric elements states with build-in measurements circuits or external sensors that are deployed outside electricity transport medium 300a and connected to controller 360. An example for internal sensing is a voltage measurement of the thermoelectric elements. Since the current is known (set by the controller) the voltage gives an indication of the thermoelectric internal resistance which provides information on the absolute temperature values and the temperature gradient the thermoelectric elements is at. More complex measurements accomplished by changing the current and tracking the voltage changes may be performed. External sensors may be thermometers spread over the object or its surface, ambient temperature sensors or any other sensors that are needed for controller 360.

The following section describe an exemplary implementation and implementation alternatives for realizing electricity transport medium 300a. FIG. 7 includes an exemplary circuit 322 of polarity setting block 320. The circuit contains four MOSFET transistors Q1-Q4 act each as a switch and four protection diodes D1-D4 (usually they are an intrinsic diodes of the MOSFET), The two wire port of the thermoelectric element is connected in the middle of the bridge while the connection to the supply or load is done by the two wires in the left of the circuit drawing. Four control signals CNTL1-CNTL4 are setting the bridge polarity. When Q1 and Q4 are on and Q2 and Q3 are off one polarity is set and when Q2 and Q3 are on and Q1 and Q4 are off the reverse polarity is set.

FIG. 7 also includes an exemplary circuit 332 of supply setting block 330. The circuit contains operational amplifier, MOSFET transistor and a small feedback current sensing resistor. The amount of current supply is set by the Vset voltage supplied to the non-inverting (positive) input terminal of the operational amplifier.

In addition FIG. 7 includes an exemplary circuit 342 of load setting block 340. The circuit contains an input short-term current regulator comprising a parallel capacitor, a serial inductor, a gating MOSFET transistor, and a diode. The amount of current that will be driven from the thermoelectric element is dictated by the duty cycle of a PWM gating signal applied to the gate of the MOSFET transistor. The last exemplary circuit illustrated in FIG. 7 is a circuit 352 of electrical energy storage block 350. In this case the storage circuit is simply a capacitor. Alternatively, the circuit of electrical energy storage block may be capacitor array, supper capacitor, rechargeable battery, or the like.

Electricity transport medium 300a may be implemented by variety of circuits and arrangement of the components that differ slightly or fundamentally from the above exemplary circuits. The transistors in the circuits might be using different technology such as JFET, Bipolar or the like. Load setting block 340 and supply setting block 330 for each thermoelectric element, which for clarity reason kept apart, may be integrally implemented with a single push pull circuit or other electrical circuit architectures. Alternatively, polarity setting block 320, Load setting block 340 and supply setting block 330 are implemented in single circuit. Electrical energy storage 350 may contain interface circuits such as DC to DC convertors, charger/discharger or the like. An element in electrical energy storage 350 may be rechargeable battery or super-capacitor or the like. As been demonstrate in the exemplary circuits, having single technology transistor type, such as MOSFET open the door for single chip implementation of electricity transport medium 300a. CMOS type digital microcontroller might be integrated as controller 360. Die size can be as small as 1×1 millimeter supporting dozens of thermoelectric elements as well as sophisticated programmable control program to optimize the performance. An integrated circuit embodiment for a thermal management system in accordance with the present invention is provided hereinafter.

Additionally or alternatively, the electricity transport medium contains one or more DC to DC convertor circuit.

Additionally or alternatively, the electricity transport medium contains one or more load matching circuit.

Additionally or alternatively, the electricity transport medium contains one or more load setting circuit.

Additionally or alternatively, the electricity transport medium contains one or more electrical switch.

Additionally or alternatively, the electricity transport medium contains one or more polarity setting circuit.

Additionally or alternatively, the electricity transport medium contains one or more supply setting circuit.

Additionally or alternatively, the electricity transport medium contains one or more electrical energy storage circuit.

Additionally or alternatively, the thermal management system comprises one or more light emitting sources to release surpass unneeded electrical energy.

Additionally or alternatively, the thermal management system comprises one or more electrical heaters (e.g., a resistor) to heat object locations using electrical energy.

Additionally or alternatively, the thermal management system comprises one or more power supply ports to provide an additional electrical energy to the thermal management system.

Additionally or alternatively, the thermal management system comprises one or more power delivery ports to release an unnecessary electrical energy from the thermal management system.

Additionally or alternatively, the thermal management system comprises one or more light convertors to provide an additional electrical energy to the thermal management system.

Additionally or alternatively, the thermal management system comprises one or more one or more sensors, wherein the transfer of energy is controlled conditioned upon the reading of the sensors.

Figure 8:
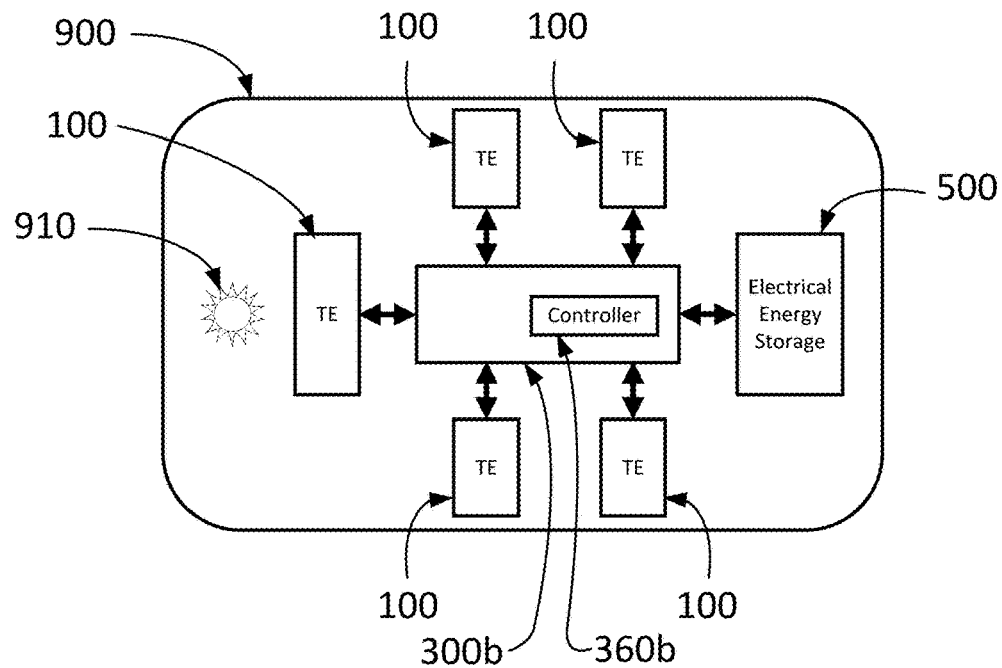
FIG. 8 is a simplified block diagram of a thermal management system in accordance with some other embodiments of the present invention.

Reference is now made to FIG. 8. FIG. 8 illustrates a simplified block diagram of a thermal management system of an object 900 with thermal management system comprising one or more thermoelectric elements 100, electricity transport medium 300b, a controller 360b and an electrical energy storage 500. For clarity, five thermoelectric elements 100 are illustrated in the figure, but as small as one and as large are thousands or millions thermoelectric elements 100 may be deployed inside or on object 900. Object 900 comprise heat source 910. Optionally, plurality of heat sources are existing in object 900. Heat source 910 is located inside object 900. Additionally or alternatively, heat sources are located on the surface of object 900. Additionally or alternatively heat sources are located outside object 900 and part of this heat is absorbed into object 900. The existence of heat sources creates non-uniform temperature distribution over object 900.

Controller 360b controls electricity transport medium 300b so that some thermoelectric elements 100 act in electricity generation mode and some others thermoelectric elements 100 act in heat pumping mode while the rest of thermoelectric elements 100 might be inactive (i.e., in heat flow blocking mode or heat flow transferring mode). Electricity transport medium 300b may be implemented with merely conducting elements and switches or with electronic circuitry such as the one that was illustrated in FIG. 7 or the like. When the total electrical energy generated from the thermoelectric generators is greater than the total energy supplied to the thermoelectric heat pumps, the remaining electrical energy is stored in electrical energy storage 500. When the total electrical energy generated from the thermoelectric generators is less than the total supplied energy to the thermoelectric heat pumps, the additional needed electrical energy is supplied from electrical energy storage 500. Additionally or alternatively, some heat energy that is generated by heat source 910 or absorbed by object 900 is converted by thermoelectric elements 100 to electricity which in turn is stored by electrical energy storage 500. The electrical energy that is stored in electrical energy storage 500 is used to pump heat energy into object 900, or to pump out heat energy from object 900 or pump heat between locations inside object 900 by transfer the electrical energy from electrical energy storage 500 to thermoelectric elements 100.

Additionally or alternatively, the electrical energy storage 500 comprises one or more batteries.

Additionally or alternatively, the electrical energy storage 500 comprises one or more capacitors.

Additionally or alternatively, the electrical energy storage 500 comprises one or more super capacitors.

Additionally or alternatively, in an exemplary embodiment of the invention, a portion of energy generated by some of thermoelectric elements 100 that are working in an electricity generation mode is transferred to electrical energy storage 500 and a portion of the energy stored in electrical energy storage 500 is transferred to some other thermoelectric elements 100 that are working in a heat pumping mode.

Additionally or alternatively, in an exemplary embodiment of the invention, a portion of energy generated by thermoelectric elements 100 is transferred to electrical energy storage 500 and a portion of the energy stored in the electrical energy storage is transferred to a light emitting sources. Optionally, a minimal level of energy is stored in electrical energy storage 500 before electrical energy is transferred to the light emitting sources.

Additionally or alternatively, in an exemplary embodiment of the invention, some of thermoelectric elements 100 are configured to be in an electricity generation mode and some others thermoelectric elements 100 are configured to be in a heat pumping mode, and a portion of the electrical energy generated by the thermoelectric elements in the electricity generation mode is transferred to the thermoelectric elements in the heat pumping mode.

Additionally or alternatively, in an exemplary embodiment of the invention, some heat energy that is generated or absorbed by object 900 is converted by thermoelectric elements 100 to electrical energy which is stored by electrical energy storage 500 and the electrical energy that is stored in electrical energy storage 500 is used to pump heat energy into said object, out from said object or inside said object by transferring the electrical energy from said electrical energy storage to said thermoelectric elements. Optionally, at least one thermoelectric element is generating electrical energy which is delivered to electrical energy storage 500 in a portion of the time and the delivered energy is taken out from electrical energy storage 500 in a different portion of the time to supply electrical energy to the at least one thermoelectric element while the element is configured to operate in heat pumping mode.

In an exemplary embodiment of the present invention, object 900 has a heat source 910 that is alternately emit heat or does not emit heat. Such a case is found for example in combustion engine when only the combustion stroke produce heat or in a cutting insert installed in a milling machine where only in part of a rotation cycle the cutting edge is in contact with the workpiece or in injection mold where only the injection phase provide the heated liquid that heat the mold. One strategy that is applied by the thermal management system is to utilize the duration heat source 910 is in "on" state (emit heat) to use the thermoelectric elements 100 in electricity generation mode since the temperature gradient is higher during this phase. The converted electrical energy is stored by electrical energy storage 500. In the rest of the time (the "off" state) thermal management system utilize the thermoelectric elements 100 in heat pumping mode using the electrical energy previously stored in electrical energy storage 500. Alternatively, thermoelectric elements 100 is directly connected to electrical energy storage 500 and controller 360b controls the flow in such a way that whenever a threshold temperature is reached the electrical energy stored in electrical energy storage 500 is used to cool down locations in object 900.

Figure 9:
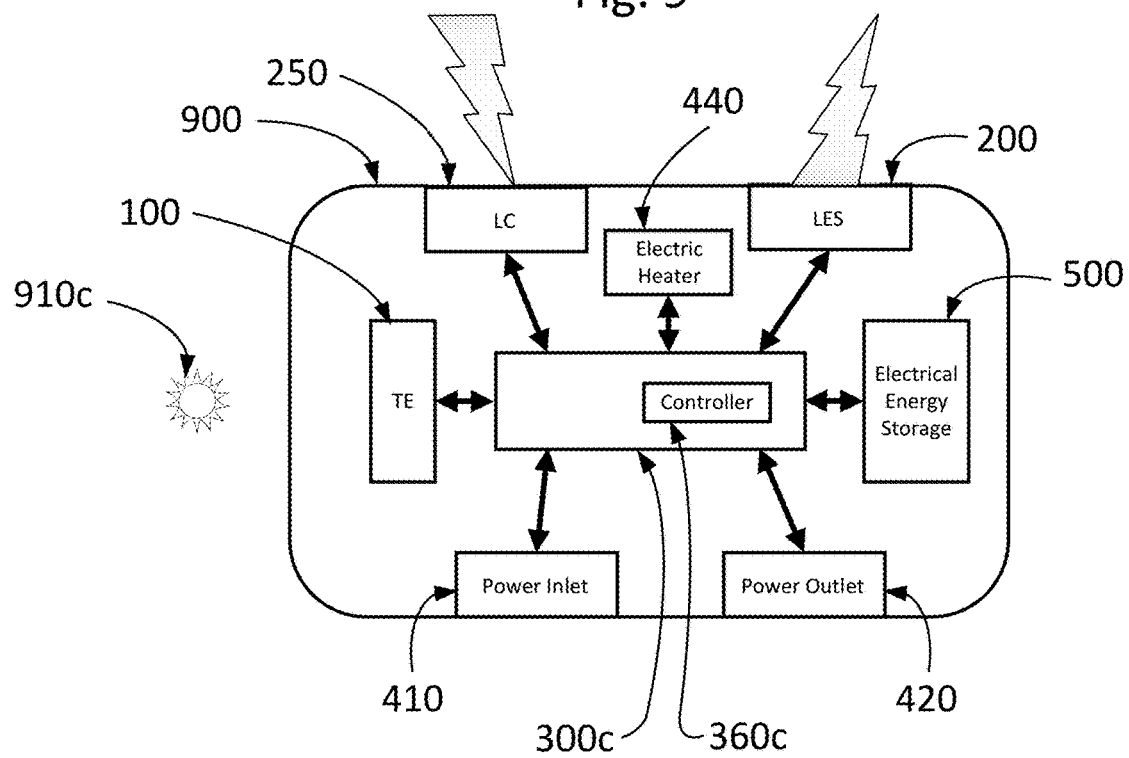
FIG. 9 is a simplified block diagram of a thermal management system in accordance with yet another embodiments of the present invention.

Reference is now made to FIG. 9. FIG. 9 illustrates a simplified block diagram of a thermal management system equipped with additional types of energy sources or sinks to absorb or dispose heat from an object. Object 900 thermal management system comprising: one or more thermoelectric elements 100. Optionally, thermal management system comprises one of or any combination of one or more light emitting sources 200, one or more light convertors 250, electricity transport medium 300c integrated with a controller 360c, one or more electrical power inlets 410, one or more electrical power outlet 420, one or more electric heater 440 and one or more electrical energy storage 500. Heat source 910c illustrated in the figure is in this exemplary embodiment is located outside object 900.

Light convertors 250 is an element that convert light to electrical energy. An example for such element is a solar cell. Electrical power inlets 410 is a port (e.g., connector or plug) located on object 900 surface that enable external electrical energy supply to the thermal management system. Optionally, electrical power inlet 410 is connected to the electrical grid. Electrical power outlet 420 is a port (e.g., connector or plug) located on object 900 surface that enable electrical energy delivery to the external environment by the thermal management system. Electric heater 440 is an element that convert electrical energy to heat. An examples for such elements are a resistor, a filament or any other device that produce significant heat whenever electrical current is passing through the device. Transport medium 300c control the flow of energy between all those electrical energy sources and sinks. This is done on the base of the thermal state of object 900 using the inelegance incorporated into controller 360c.

In exemplary embodiment of the invention a thermal management system for an object comprising: one or more thermoelectric elements; and one or more light convertors; and some light energy that is absorbed by the light convertors is converted to electrical energy that is transferred to the thermoelectric element.

In exemplary embodiment of the invention an apparatus (e.g., a machine or a tool) integrating the thermal management system described hereinabove in to the apparatus.

In the following sections, examples which together with the above descriptions illustrate some embodiments of thermal management systems for specific applications of the invention in a non-limiting fashion.

Figure 10:
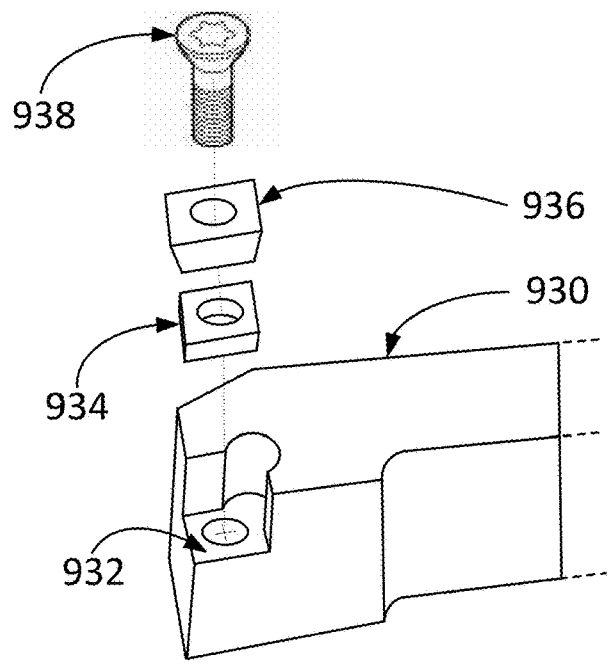
FIG. 10 is an exploded isometric view of a typical turning cutting tool object.

Reference is now made to FIG. 10. FIG. 10 illustrates an exploded isometric view of a typical turning cutting tool object. The cutting tool comprises a tool holder 930, a seat 934, an insert 936 and a locking screw 938. Seat 934 and insert 936 are placed in a pocket 932 of tool holder 930 and are locked by screw 938. Tool holder 930 is connected to a turning machine (not shown in the figure) that moves tool holder 930 towards a turning workpiece (not shown in the figure). Insert 936 is made from hard materials and comprises one or more cutting edges that cut the workpiece. The cutting edge of insert 936 generate a significant heat during cutting operation and the temperature on the cutting surface may be heated to hundreds and sometimes even more than a thousand degrees Celsius. Insert 936 suffer wear and is frequently replaced. In many cases insert 936 is indexable, i.e., contains several cutting edge that can be switch as the active cutting edge before insert 936 is replaced. In the figure, insert 936 contains four cutting edges.

Figure 11:
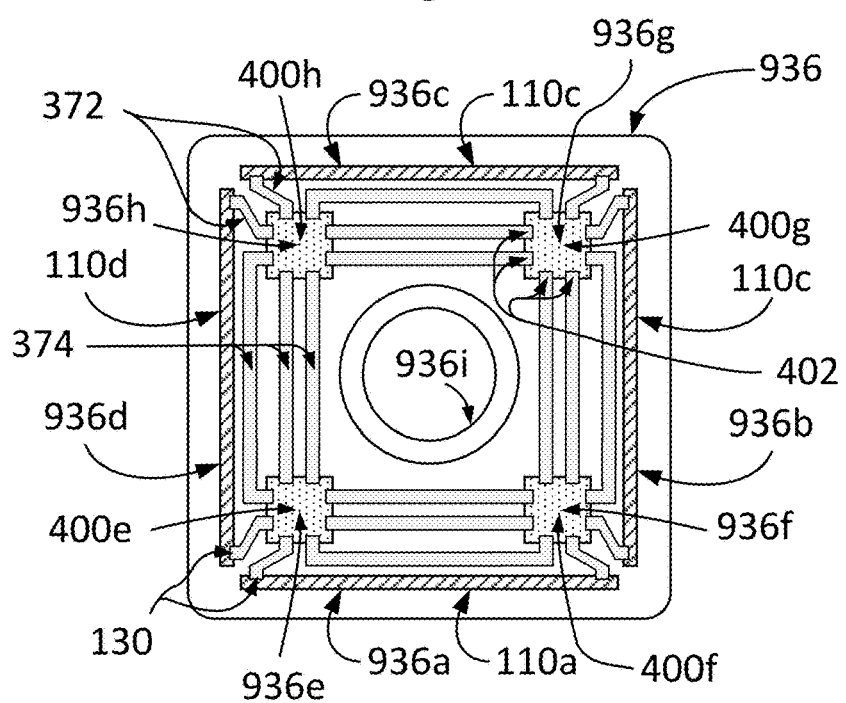
FIG. 11 is a top view of a cutting tool insert of FIG. 10 with a thermal management system in accordance with an exemplary embodiment of the present invention.

The purpose of the presented hereinafter thermal management system for machining, such as turning, milling and drilling is to control insert 936 temperature in order to keep the cutting edges toughness and strength properties, to reduce the wear of the cutting edge, and to extend the life time of insert 936. This is done by using the various types of embodiments that are presented in FIGS. 1-9. The present invention methods are independent from the other known in the art methods for cooling insert 936, such as high pressure fluid coolant injection, and can be implemented and used concurrently Reference is now made to FIG. 11. FIG. 11 illustrates a top view of a cutting tool insert with a thermal management system in accordance with an exemplary embodiment of the invention. Insert 936 is fabricated using standard fabrication techniques, e.g., powder press and sintering for carbide made insert. Insert 936 is prepared with four slits 936a-936d which are located in parallel and in proximity to the four cutting edges of insert 936. In addition, four square shaped groves 936e-936h as well as twenty shallow groves are prepared on the top face of insert 936. Mounting hole 936i is fabricated in insert 936 as well. During manufacturing, a step of inserting four thermoelectric elements 100a-100d into slits 936a-936d is performed. In each side of each thermoelectric element 100a-100d there is a conductive contact 130. In the next manufacturing step, four dies 400e-400h are deployed into groves 936e-936h. Each die contains an electronic circuit that include light emitting source, switches, controller and optionally any other elements of thermal management system discussed above. Each die 400e-400h comprises eight contacts 402 located in the die perimeter. The above mentioned twenty shallow groves are filled with conducting material and connect the thirty two contacts 402 among themselves and with the eight contact 130 as illustrated in the figure. The eight conductive contact 130 of the thermoelectric elements 100a-100d are connected to eight contacts 402 (two contacts in each die 400e-400h in the respective die corner) using conductive bars 372. The other twenty four contacts 402 are connected between each other's using twelve conductive bars 374 to form a three electrical connection between any two adjacent dies 400e-400h. The thermal management system setup each thermoelectric element 100a-100d to electricity generation mode or heat pumping mode in accordance with insert 936 thermal condition, e.g., which side of the insert is currently active (i.e., used for cutting), what is the temperature distribution on the insert, etc. The thermal management system may release heat energy in the form of light using the light emitting source, e.g., a LED, comprises in each dies 400e-400h. Due to the proximity of at least one thermoelectric element to the active cutting edge and the large gradient that developed on this thermoelectric element a significant heat can be quickly displaced from the insert using the light emission which is an additional independent path of energy disposal. In addition, the other three thermoelectric elements are also having a temperature gradient so they can generate electricity energy that is delivered to the thermoelectric element in proximity to the active cutting edge to further evacuate heat from this critical area.

Figure 12:
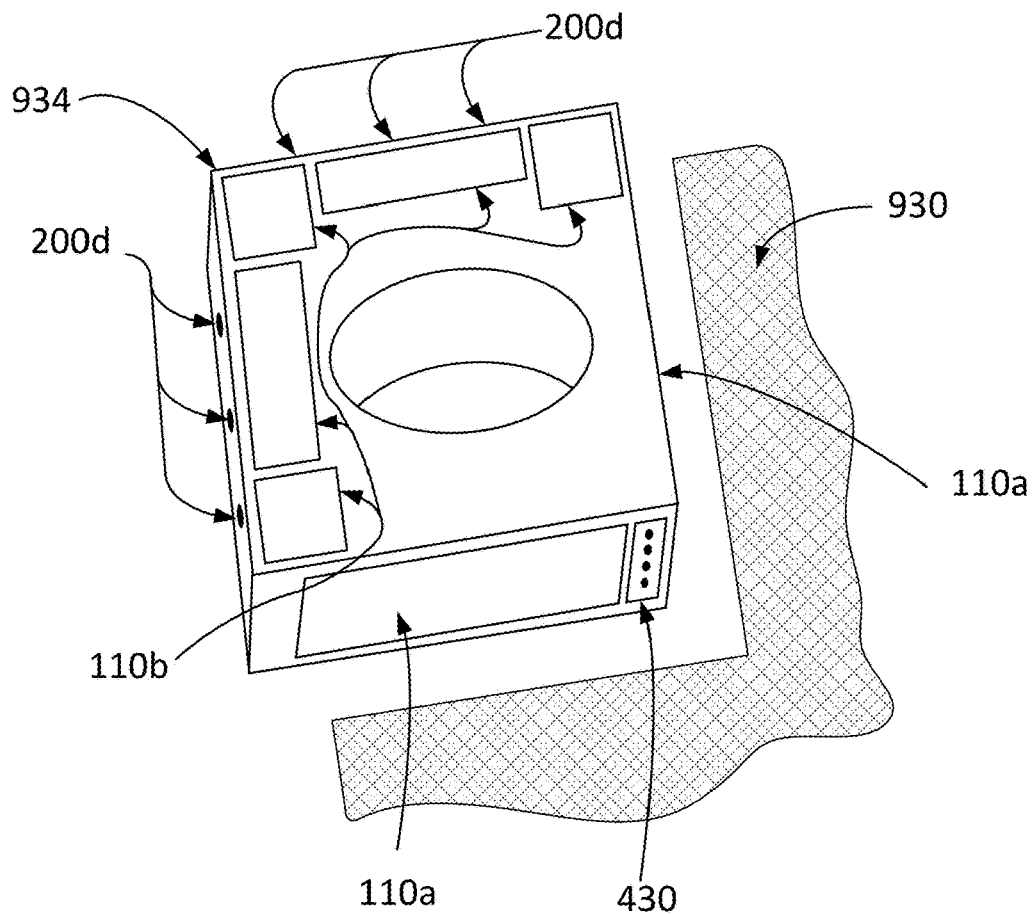
FIG. 12 is an isometric view of seat of FIG. 10 with a thermal management system in accordance with an exemplary embodiment of the present invention.

Reference is now made to FIG. 12. FIG. 12 illustrates an isometric view of seat 934 with thermal management system in accordance with the present invention. Seat 934 have four sides. Two of the sides are in contact with the matching pocket faces of tool holder 930 (shown in cross section view for illustration clarity) and the other two sides are located under the insert edges that are possibly used as a cutting edge. Accordingly, two thermoelectric elements 110a (only one of them is visible in the figure) are located on the side faces that are attached to tool holder 930. Thermoelectric elements 110a can transfer or pump heat from seat 934 to tool holder 930. On the top surface of seat 934, in proximity the two sides that are the possible cutting edge, second thermoelectric elements 110b are deployed (five such elements are illustrated in the figure). Thermoelectric elements 110b are used to transfer heat generated by the cutting edge from the insert to the pocket. On the two sides of seat 934 that are close to the possible cutting edge (usually those sides have a free space clearance to emit light), six LEDs 200d are located, three are illustrated in the left side of the figure and three are on a back side that is not visible in the figure. For the sake of clarity, electricity transport medium and the controller of the thermal management system are not illustrated in the figure but one may implement them, for example, at the bottom side of seat 934. Optionally, other elements such as electrical energy storage may be integrated to into seat 934. Optionally, thermal management system of seat 934 comprises a connector 430. Connector 430 is connected to tool holder 930 that may have an electrical energy source or sink and optionally provide additional circuitry such as a controller, electricity transport medium circuitry or electrical energy storage elements or a combination thereof.

Figure 13:
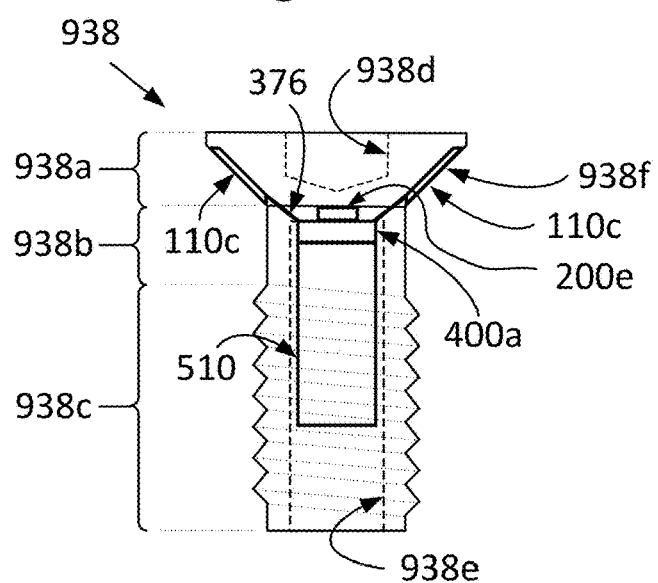
FIG. 13 is a cross section view of a cutting tool insert locking screw of FIG. 10 with thermal management system in accordance with the present invention.

Reference is now made to FIG. 13. FIG. 13 illustrates a cross section view of a cutting tool insert locking screw with thermal management system in accordance with the present invention. A locking screw 938 comprises head 938a, shank section 938b and thread section 938c. Head 938 top surface has a keyhole 938d to enable screw driver locking and release operations. Shank section 938b and thread section 938c has a cylindrical bore 938e to enable cooling and to contain elements of the thermal management system. The bottom side of head 938 has conical countersink surface 938f that touches the object to be thermally managed (e.g., the insert). Thermal management system implemented in screw 928 comprises thermoelectric elements 110c located on the conical countersink surface 938f. The number of thermoelectric elements 110c may be ranged from one, which spread over the all cone surface, to several, e.g., 3, 4, 6 or 8, which split the cone surface to several sectors. Thermoelectric elements 110c are connected to a die 400a via conductive elements 376. Die 400a comprising a controller, electricity transport medium elements such as switches, supply setting blocks, load setting blocks and the like. Die 400a drive the electrical energy to a LED 200e located in top of die 400a and under keyhole 938d. The light emitted from LED chip is able radiate through the thin layer between LED 200e and the keyhole bottom surface then continue to propagate through the hole into the free space environment. Die 400a also connected to rechargeable battery 510. The thermal management system controller is constantly control the level of charge of rechargeable battery 510. The controller keeps some available capacity to allow electrical energy sink whenever thermoelectric elements 110c generating electrical energy that cannot be instantaneously emitted through LED 200e. In addition, the controller keeps the battery charged enough to supply energy for the controller itself as well as the energy for heat pumping mode when needed. In the case the screw is locking a cutting tool insert some of the heat developed on conical countersink surface is pumped from the insert to the screw and emitted by the LED in order to cool the insert and provide longer life time to the insert.

Additionally or alternatively, tool holder comprises thermal management elements such as electricity transport medium, light emitting sources, controllers, electrical energy storage and the like. It is important to note that tool holder usually have more space than other component of cutting tool system and they are typically the most expensive part that can afford both from space aspects and from cost aspects the addition of more sophisticated electronics.

In an exemplary embodiment of the invention the thermal management system is implemented in variety types of fastening elements (e.g., hinge, latch, nut, bolt, screw) of variety types of objects (e.g., machine, apparatus, tool).

The thermal management system for cutting tools was described in the context of separate embodiments for each turning element, however a thermal management system may be provided in combination in a single embodiment. Conversely, various features described in the context of a single embodiment, may also be provided separately or in any suitable subcombination and with a proper geometric design changes.

For clarity, thermal management system for machining and cutting tools, in general, was described in the context turning, however a thermal management system may be provided in the context of milling, drilling, grinding, burnishing, sawing or any other machining that produce heat during operation over a workpiece.

Another exemplary field of application for the thermal management system is injection molding. Injection molding is a manufacturing process for producing parts by injecting material into a mold. Injection molding can be performed with a host of materials, including metals, (for which the process is called casting), glasses, elastomers, confections, and most commonly thermoplastic and thermosetting polymers. Material for the part is fed into a heated barrel, mixed, and forced into a mold cavity, where it cools and hardens to the configuration of the cavity. Molds are made by a mold-maker (or toolmaker) usually from metal, typically either steel or aluminum. Since the injection involved hot material entering the cavity and the thermal process of cooling and hardening may affect the final quality of the produced part, a thermal management system in accordance with the present invention that dynamically control the temperature of the mold is highly desired and taught hereby.

Figure 14:
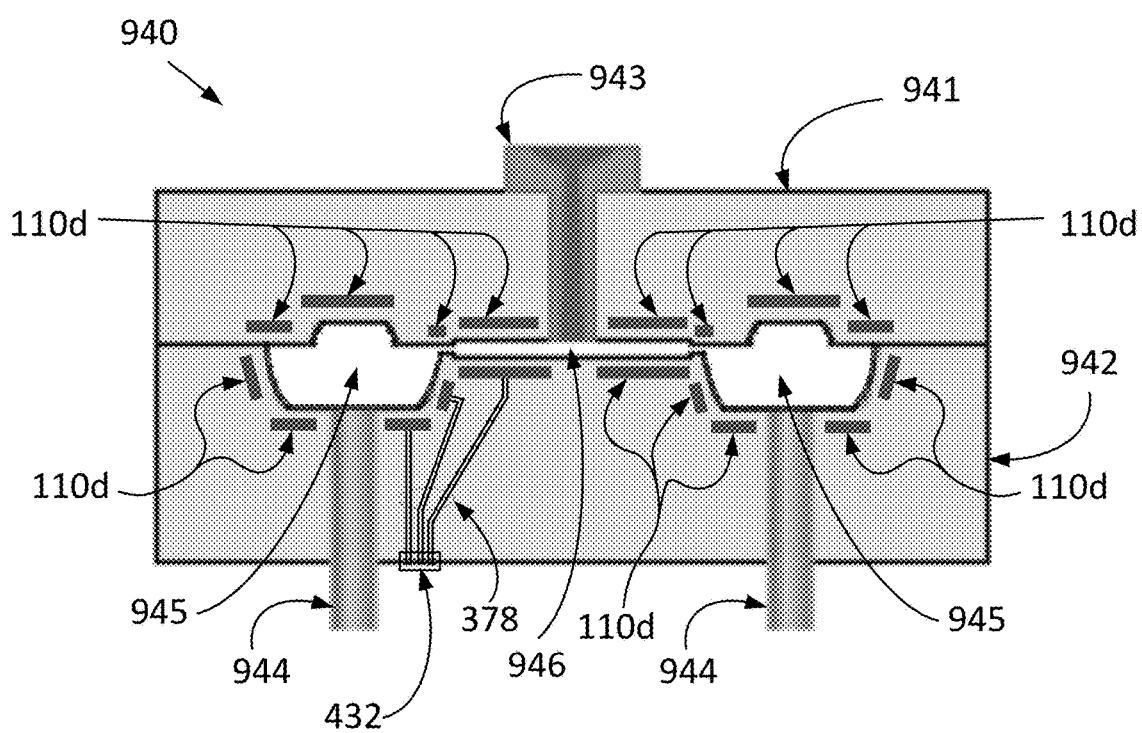
FIG. 14 is a cross sectional view of simplified mold with thermal management system in accordance with the present invention.

Reference is now made to FIG. 14. FIG. 14 illustrates a cross sectional view of simplified mold 940 with thermal management system in accordance with the present invention. Mold 940 comprises injection mold 941 (top part in the figure) and the ejector mold 942 (bottom part in the figure). Injection mold 941 comprises a sprue 943 which enables the injected material enter the mold. Ejector mold 943 comprises an ejector pins 944 which push the finished molded parts out of a mold. Mold 940 is designed to have a plurality of cavities in between injection mold 941 and the ejector mold 942. The first type of cavities are part cavities 945 (two are illustrated in the figure). Molds can be of a single part cavity or multiple cavities. In multiple cavity molds, each cavity can be identical and form the same parts or can be unique and form multiple different geometries during a single injection molding cycle. The injection molding cycle begins when the mold closes, followed by the injection of the material into the mold cavities. Once the cavity is filled, a holding pressure is maintained to compensate for material shrinkage. In the next step, the injection stops and once the part is sufficiently cool, the mold opens and the part is ejected. The second type of cavities is runner cavities 946. The molten injected materials enters the mold through sprue 943, flows through runner cavities 946 enters into part cavities 945. The fluid connection between the runner cavities 946 and the part cavities 945 are called the gates and they typically designed with special narrowing geometry to enable easy disconnecting of the parts from the runners as well as provide fast solidification of the gates area to shorten the injection molding cycle.

Thermal management system of mold 940 comprises a plurality of thermoelectric elements 110d spread inside the mold and deployed wisely to allow temperature control over the cavities boundaries. Thermoelectric elements 110d are deployed inside mold 940 (as shown in the figure). Additionally or alternatively, thermoelectric elements 110d are deployed on the surface of mold 940. Thermoelectric elements 110d ports are connected using conductive elements 378 to a connector 432 (for the sake of clarity connections of only three thermoelectric elements are illustrated in the figure). Driving and sinking current from thermoelectric elements 110d is done using an electricity transport medium connected to connector 432 and driven by a controller. Optionally, light emitting sources, electrical energy storage and external power supply from the grid are also embedded in to the thermal management system.

Additionally or alternatively, mold 940 comprises part of or all thermal management system elements such as electricity transport medium, light emitting sources, controllers, electrical energy storage and the like internally in mold 940 structure.

The task of the thermal management system in mold applications is to provide a dynamic optimal temperature distribution over the mold cavities during injection molding cycle. In cases where shortening the cycle is the goal, cooling the gates area is an important task to achieve this goal. In case the materials cools too fast, heating the runners during injection step might be another task. Yet another task of the thermal management system is to be induce a uniform solidification of the part in the cavity. This can be done be heating thin areas in the cavities so that they will not cool faster than the thick areas in the cavity or alternatively, for faster cycle time, force cooling of the thick areas while maintain a natural cooling in the thin areas. More uniform solidification of the part yield better part quality.

Yet another application for the thermal management system in accordance with the present invention is combustion engines. Combustion engine produce significant amount of heat and cooling the engine is a major task usually done mainly by a water coolant subsystem. Recently, electricity generation, i.e., energy harvesting, using thermoelectric elements from some of this wasted heat is emerging. However, thermoelectric technologies is not yet used for optimally mange the temperature of the engine block. The thermoelectric elements are not tuned (by a non-matching loading or heat pumping mode) to control the heat flow inside the engine block or between the engine block and the environment to achieve tasks that are not merely global cooling or energy harvesting.

Figure 15:
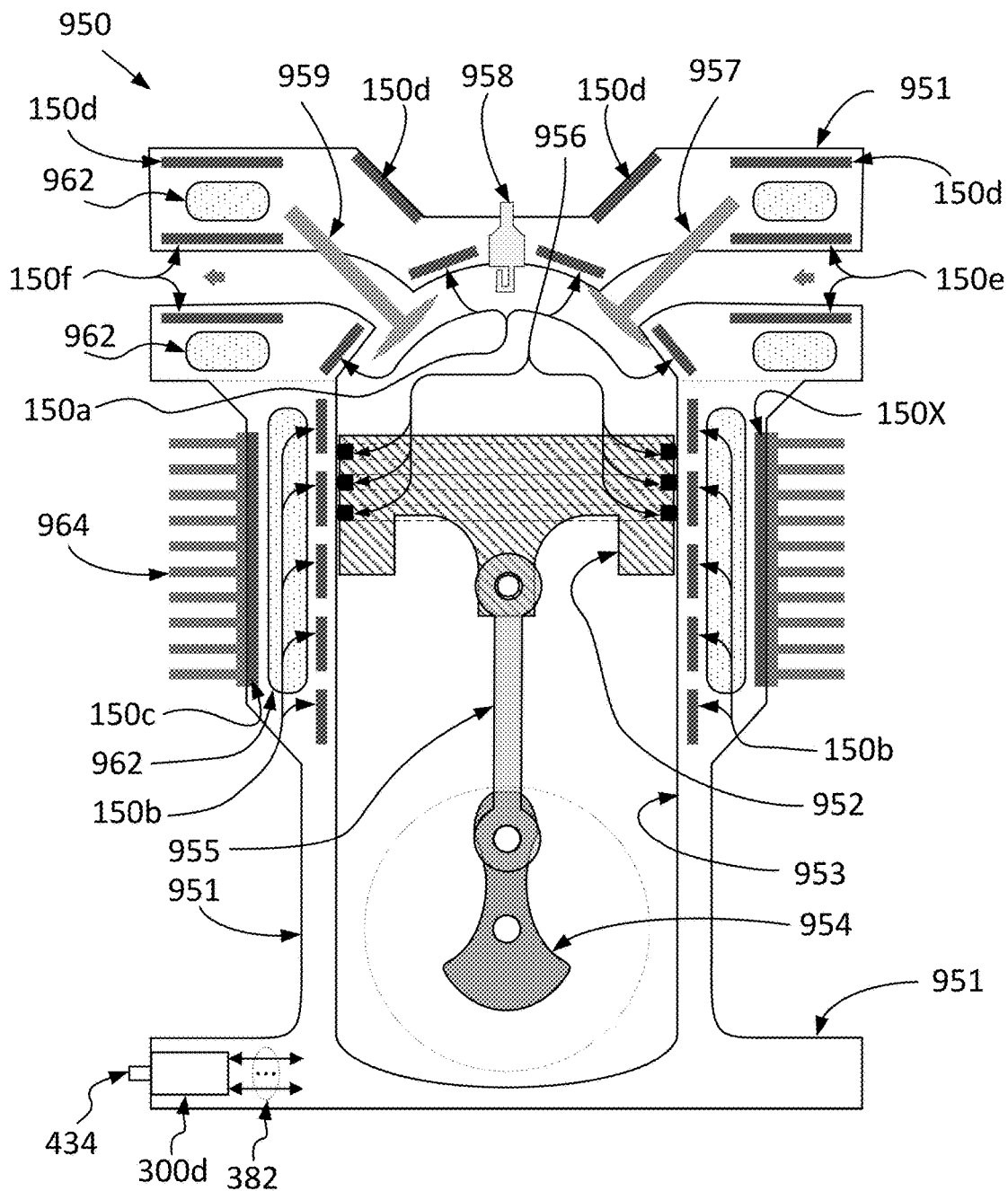
FIG. 15 is a conceptual cross sectional view of one cylinder in a four strokes combustion engine in accordance with the present invention.

Reference is now made to FIG. 15. FIG. 15 illustrates a conceptual cross sectional view of one cylinder in a four strokes combustion engine 950 in accordance with the present invention. Engine 950 comprises engine block 951, optionally split into two parts: head and body. Engine block 951 comprises a piston 952 located in a cylinder 953 which is a cylindrical cavity that enable piston 952 to move linearly from top to bottom or vice versa. One such piston 952 movement is known as a stroke. The linear movements of piston 952, i.e., the strokes, are mechanically converted to a circular motion of a crankshaft 954 with the mediation of a connection rod 955 which connect piston 952 and crankshaft 954 using bearings in both ends of connection rod 955. The movement of piston 952 is forced by gas pressure in the combustion chamber created by the top part of cylinder 953 and the top surface of piston 952. To have efficient operation it is important to seal the space between piston 952 and cylinder 953. This is done using rings 956 fitted around its circumference of piston 952 (three rings are illustrated in the figure). In the 4-stroke engine cycle each piston 952 experiences 2 strokes per crankshaft 954 revolution in the following sequence:

Stroke 1 (suction)—An intake valve 957 open as piston 952 moves downward increasing the volume of the combustion chamber and allowing air-fuel mix to enter.

Stroke 2 (Compression)—Intake valve 947 is closed and piston 952 moves upward reducing the combustion chamber volume until reaches its minimum volume. The piston performs work on the air-fuel mix as it is being compressed; as a result air-fuel mix pressure, temperature and density increase. Just before piston 952 reaches its top position, ignition begins by a spark generated by a spark plug 358 located at the top of the combustion chamber.

Stroke 3 (Work)—The pressure of the combustion gases pushes piston 952 downward, generating more work than it required to compress the air-fuel mix. Complementary to the compression stroke, the combustion gases expand and as a result their temperature, pressure and density decreases. When 952 piston reaches its bottom position an exhaust valve 959 opens.

Stroke 4 (Exhaust)—Exhaust valve 959 remains open while piston 952 moves upward expelling the combustion gases. At the end of this stroke, exhaust valve 959 closes, intake valve 957 opens, and the sequence repeats in the next cycle.

Combustion engine generates significant heat hence cooling is required to remove excessive heat. Overheating can cause engine failure, usually from wear, cracking or warping. Two most common forms of engine cooling are air-cooled and water-cooled. Water cooling are based on water channels 962 that are located inside engine block 951. The water are circulating to external radiator thus improves heat transfer from internal parts of the engine. In addition, the exemplary embodiment of the engine comprises air cooling by heat sink 964 covering the outside of engine block 951 around the area of the stroke movement of piston 952 in cylinder 953. Heat sink 964 comprises fins which increase the surface area that air can act on. Air may be force fed with the use of a fan or simply by natural air flow if the engine is in movement relative to air. About 40% of the heat generated by a combustion engine is released by the exhaust gases some of this wasted energy can be used for generating electricity using thermoelectric elements as been thought for example by U.S. patent application Ser. No. 13/861,787 filed on Apr. 12, 2013.

Thermal management system of the engine comprises a plurality of thermoelectric elements. Those thermoelectric elements in this exemplary embodiment are divided into four groups: cylinder head thermoelectric elements 150a, cylinder stroke thermoelectric elements 150b, cooling thermoelectric elements 150c, engine block thermoelectric elements 150d, intake thermoelectric elements 150e and exhaust thermoelectric elements 150f. In addition, thermal management system comprises electricity transport medium 300d with, optimally, an integrated controller and a connector 434 to transfer electrical energy and signaling from/to the on object portion of the thermal management system. Electricity transport medium 300d is connected using conductive elements 382.

Additionally or alternatively, engine 950 comprises part or all thermal management system elements such as light emitting sources, controllers, electrical energy storage and the like internally. Emitting using light emitting sources may be used as alternative cooling system. However in the case that the engine is in a mobile platform and is not connected to the grid, it will be better choice in most cases to deliver the excessive electric energy, if generated, to a central platform electrical storage device, e.g., the vehicle battery. Alternatively, light emitting sources may be used to provide fast transfer of the heat energy from the engine block to another location in the system where the light energy is converted back to heat or electricity.

One important advantage of thermoelectric elements is their ability to change the operation very fast. For example, a 4-stroke engine running in 5000 rounds per minutes will have a cycle of 24 millisecond, thermoelectric element can change its mode of operation in at least two order of magnitude shorter of that time enabling to perform new types of thermal management activities. In accordance with an embodiment of the invention, cylinder head thermoelectric elements 150a pump heat from combustion chamber during compression stroke to keep the temperature of air-fuel mix lower. This can make the work stroke more efficient and prevent early ignition of the mixture which is well known undesirable phenomena that reduce engine performance and creates harmful side effects known as back-fires and ringing. During other strokes the heat generated in the combustion chamber converted by cylinder head thermoelectric elements 150a to electricity, hence reduced the cooling needs of the engine. Alternatively, during work stroke thermoelectric elements 150a is used to block heat flow from the cylinder head to exploit more mechanical energy from the engine. Another function that thermal management system may provide in accordance with the present invention is to minimize the temperature difference occur in the surface of cylinder 953 in the area where the linear movement of piston 952 occurs. More stable temperature reduce the wear of the engine and the friction between cylinder 953 and piston 952. This is done by exact timing of cooling or heating by cylinder stroke thermoelectric elements 150b during the work stroke in accordance to with the exact position of piston 952 which may be known to the thermal system controller. The heat created on cylinder surface is a combination of the exposed part of cylinder to the combustion gases and the friction of the piston.

Intake thermoelectric elements 150e is used either to block heat transfer from engine block 951 to the intake mixture on the intake tunnel or to heat the mixture, if, for example, self-ignition engine, e.g., diesel engine, is used. The heat in the exhaust pipe area is waste energy hence thermoelectric elements 150f are used in electricity generation mode to capture some of the released energy. engine block thermoelectric elements 150d are used for cooling the engine by heat transfer to the environment or pump heat from the environment in order to heat the engine when engine block 951 is too cold, e.g., at starting in a cold weather.

Cooling thermoelectric elements 150c are thermoelectric elements that are working in cooperation with the traditional cooling systems. As been mentioned above, in some cases one want to prevent the cooling system from taking heat energy from engine 950. One example for such condition is when the engine starts and one want it to warm up to its optimal working temperature as quickly as possible. In conventional water cooling system for engines, the cooling system comprises a valve that locks the water inside engine clock 951 until it warms up. If thermoelectric elements 150c is deployed the thermoelectric elements 150c may act as the valve that disable heat flow from the engine block 951 to the cooling system and make the mechanical valve superfluous. In some other cases, thermoelectric elements 150c may direct the heat developed in engine block 951 to flow into the cooling system, yet in other case when the cooling system keep a constant temperature difference from the engine block thermoelectric elements 150c may act as electrical energy generator that supply energy for internal and external use.

The thermal management system illustrated above with the location of thermoelectric elements and the numbers of thermoelectric elements is given herein by an example. The number of thermoelectric elements, their location, the existence and location of all other thermal management system components are all adaptable in accordance with the specific design.

The thermal management system illustrated above for a 4-stroke combustion engine is equally applicable for any kind of combustion engines, including 2-stroke combustion engines, 5 or 6-stroke combustion engines, any kind of cylinders configuration, such as, flat, V, H, U, X, W and radial shapes, Diesel engines, engines with fuel injection systems, Wankel engines, external combustion engines such as steam engines, and the like. It is also applicable to other type of engines, such as Jet engines, Gas turbines, motors such as electric motors and electric generators or any other machines that during their operation produce large amount of heat. The number of thermoelectric elements, their location as well as other thermal management system components and the thermal management goals in this case are all need to be adapted to the specific design.

Figure 16:
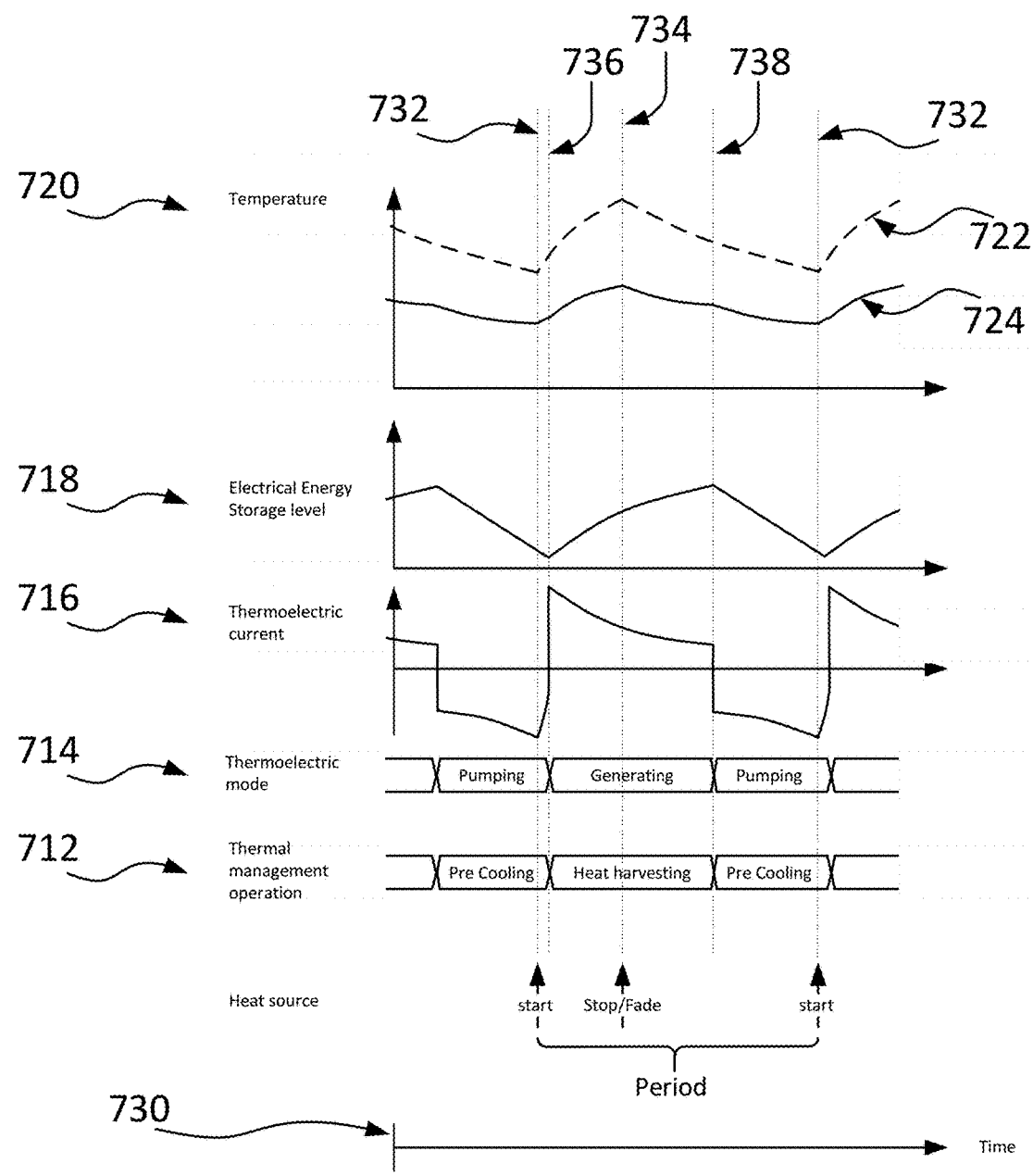
FIG. 16 is a an exemplary time diagram of a thermal management system control and operation over time in accordance with the present invention.

Reference is now made to FIG. 16. FIG. 16 illustrates an exemplary time diagram of a thermal management system control and operation over time in accordance with the present invention. In this example, the controlled object contains one heat source, and the thermal management system contains one thermoelectric element, one electrical energy storage and an electricity transport medium with a controller that control and transport the energy between the two. The time diagram presents six synchronized graphs listed from bottom to top: heat source activity 710; thermal management operation 712; thermoelectric mode 714; thermoelectric current 716; electrical energy storage 718; and object temperature 720. All graph share the same time axes 730.

The heat source has a periodic behavior with start heat generation time 732 and stop (or alternatively a fade to a certain level) time 734. For example, in the case of milling, a start time occurs when the cutting edge meets the workpiece and the stop time when the cutting edge leave the workpiece. The next start time is occurring after the rotating tool is completing a full one rotation. In the case of injection mold, the start time occurs when the hot liquid material is injected into the cavity and the heat from the hot material is degraded with time and diffused into the mold. The next start time occurs when the injection cycle repeat. In the case of combustion engine, the start time is the moment of explosion and the stop time determined by a combination of explosion end, hot gas natural cooling during expansion, and the location of the piston. The next start event is dictated by the rotation time of the engine.

Back to the example, sometime after start heat generation time 732, in time 736 the thermal management system enters heat harvesting phase. In this state electricity transport medium is matching its load to sink the maximum converted heat energy from the thermoelectric element which is in electricity generation mode. After stop time 734, in time 738 thermal management system enters pre cooling mode. In pre cooling mode, the thermal management system use the previously stored electric energy to switch the thermoelectric element to heat pumping mode. It is assumed that sometimes before the next heat cycle the temperature difference on the thermoelectric element reduces so that heat pumping become an efficient and effective cooling mode. This cooling phase further reduce the temperature of the desired location in the object to withstand better the next pulse of heating. As mentioned before the pre cooling phase may be extended in time after the heat source start to heat again as long as the cooling is still efficient and effective from one hand and there is enough energy in the electrical energy storage element from the other hand.

Reference is now made to graph 716 that plot the current flow through the thermoelectric element. As can be seen, during pumping mode (the duration between time 738 to time 732) the current is negative, i.e., the current supplied by the electrical energy storage exceed the current that is generated due to the temperature gradient over the thermoelectric element. During generating mode (the duration between time 736 and time 738) the current is positive and this current is used to load the electrical energy storage. The reason for the non-constant, non-linear decay shape of the current is due to the changes in the temperature gradient of the thermoelectric element during the operation.

Reference is now made to graph 718 that plot the energy level of the electrical energy storage element. As expected, the level increase during electricity generation mode and decrease during the heat pumping mode. In this example the energy level of the electrical energy storage element does not reach zero, however alternative thermal management system strategy may be to fully drain the storage until it reach zero. In this example, the decrease of the energy in the pre cooling phase is linear indicating that a constant power is supplied to the thermoelectric element during this stage. However, the current of the thermoelectric element is not constant due to the change in the temperature gradient of the thermoelectric device due to cooling (both due to natural heat flow and due to the heat pumping). Alternatively, thermal management system use non-constant power supply to thermoelectric element in order to achieve an optimization criteria. The increase of the energy in the heat harvesting phase is exponentially decay in this example indicating that due to a natural cooling the amount of energy that the thermoelectric element produces is decaying.

Reference is now made to graph 720 that plot the temperature of a reference spot in the thermally managed object. Two temperature lines are presented, a temperature without thermal management system operation 722 and a temperature with thermal management system operation 724. Without thermal management system the temperature is increase exponentially during the heating duration (the duration between time 732 and time 734) and decrease during non-heating duration (the duration between time 734 and the next cycle time 732). In this example, two fold advantages are achieved by the thermal management system. First, the absolute temperature at the reference spot in the object is decreased. Second, the temperature deviation is decreased as well. As can be seen in the graph, the pre cool phase further decrease the temperature over the natural cooling and also delay the heating process during the duration between time 732 and time 736.

Figure 17:
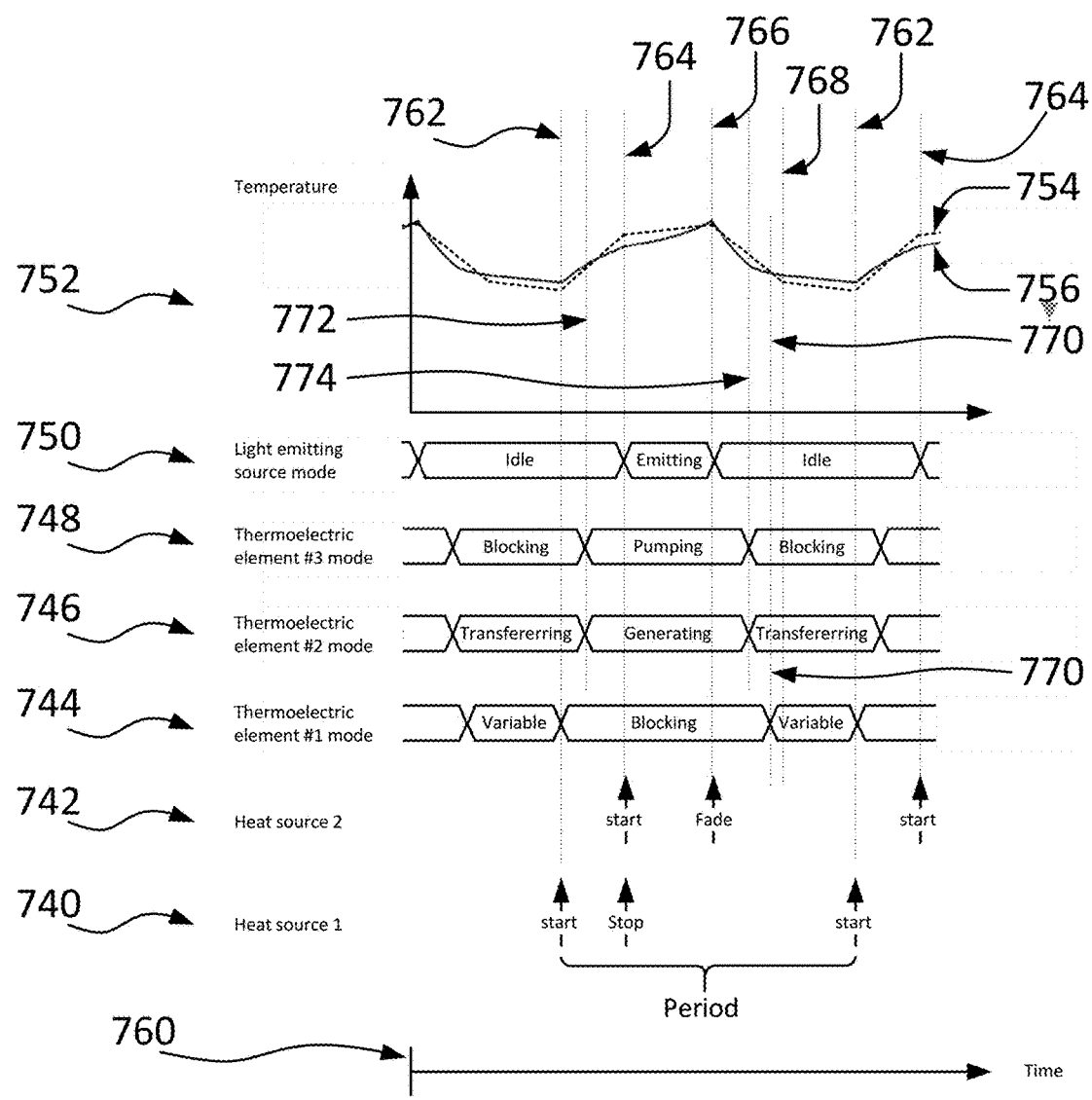
FIG. 17 is another exemplary time diagram of a thermal management system control and operation over time in accordance with the present invention.

Reference is now made to FIG. 17. FIG. 17 illustrates another exemplary time diagram of a thermal management system control and operation over time in accordance with the present invention. In this example, the controlled object contains two heat sources, and the thermal management system contains three thermoelectric elements, one light emitting source and an electricity transport medium with a controller that control and transport energy between all the thermal management system elements. The time diagram presents seven synchronized graphs from bottom to top: heat source No. 1 activity 740; heat source No. 2 activity 742; thermoelectric elements No. 1-3 modes 744-748; light emitting source state 750; and object temperature 752. All graph share the same time axes 760.

The two heat sources have a periodic behavior. The start time of heat source No. 1 is time 762 and the stop time is time 764. The start time of heat source No. 2 is time 764 and its fade to 50% of the maximum heat power supply in time 766.

Thermal management system has a target temperature to meet in a reference spot. This target is shown by line 754 in graph 752. The desired target temperature is defined using four straight lines segments. The first segment starts at time 762 (heat source No. 1 start time) and ends at time 764 (heat source No. 1 stop time and heat source No. 2 start time). The second segment starts at time 764 and ends at time 766 (heat source No. 2 half power fade time). The third segment starts at time 766 and ends at time 768 which was selected to achieve some a substantial target cooling in predetermined time after time 766. And finally, forth segment starts at time 768 and ends at time 762 which is the end of the cycle and the start of the next cycle. The target temperature in the fourth segment is to keep small linear decrease in temperature.

The actual temperature achieved by the thermal management system is shown by line 756 in the same graph. As seen in the graph the thermal management system is trying to match or follow the target temperature, however, some deviation are inevitable.

Reference is now made to graph 744 that show the mode of operation of thermoelectric element No. 1. The thermal management system has a temperature sensor that measure the actual temperature at the reference spot 756 and when in time 770 the actual temperature match the target temperature thermoelectric element No. 1 is working in variable mode. In variable mode, the load that the electricity transport medium set to interface with the thermoelectric element is such that the heat transferred through the thermoelectric element will induce a temperature at the reference spot that follow target temperature 754. As can be seen this is actually done with a small tracking error. During the rest of the time thermoelectric element No. 1 is in heat flow blocking mode which means that heat do not pass through the thermoelectric element (ignoring a leakage heat flow). This is achieved by disconnect the thermoelectric element, i.e., leave the conducting contacts of its port open.

Reference is now made to graph 746 that shows the mode of operation of thermoelectric element No. 2. Sometime after time 762 (heat source No. 1 start time), when the temperature is raised enough, in time 772, thermoelectric element No. 2 is entered into electricity generating mode. Thermoelectric element No. 2 is located in proximity to the heat sources to be able to capture the created heat energy. Thermoelectric element No. 2 is kept in electricity generating mode until after heat source No. 2 fade and the temperature is decreased, i.e., got under certain threshold, in time 774. During the rest of the time thermoelectric element No. 2 is in heat flow transferring mode, which means that maximum possible heat flow pass through the thermoelectric element. This is achieved by shortening the thermoelectric element, i.e., connect the conducting contacts of the thermoelectric element port to each other.

Reference is now made to graph 748 that shows the mode of operation of thermoelectric element No. 3. Between time 762 and time 772 (The time that thermoelectric element No. 2 is in electricity generating mode) thermoelectric element No. 2 is in heat pumping mode. Thermoelectric element No. 2 is located in proximity to the environment or other cooling system to enable transfer of heat out of the object hence cool the object. The energy for the pumping is supplies from the energy generated by thermoelectric element No. 2. During the rest of the time thermoelectric element No. 3 is in heat flow blocking mode.

Reference is now made to graph 750 that shows the mode of operation of the light emitting source. The light emitting source is on, i.e., emitting light and taking away from the object some of the heat energy between times 764 and 766. During this time the temperature is maximal and the energy generated by thermoelectric element No. 2 exceed the energy consumed by thermoelectric element No. 3. The excessive energy is transferred to the light emitting source that emit this excessive energy in the form of light.

In an exemplary embodiment of the invention, the controller controls the emission of light by the light emitting source to emit light only in a portion of the time. Optionally, the emission time is condition upon the location or orientation of the object.

In an exemplary embodiment of the invention, the controller controls the mode of operation of the thermoelectric elements and each thermoelectric element in any portion of time is configured to be in one of the four modes of an electricity generation mode, a heat pumping mode, a heat flow blocking mode or a heat flow transferring mode.

It is appreciated that the features of the invention, which are, for clarity, described in the context of two separate time diagrams, may also be provided in suitable combination or as suitable with an appropriate modification, in any other described embodiment of the invention. Certain features described in the context of various embodiments are not to be considered essential features of those embodiments, unless the embodiment is inoperative without those elements.

Although the features has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the invention. To maintain flexibility and support as many as possible embodiments a programmable integrated chip that simplifies the implementation of a thermal management system in accordance with the present invention is presented next.

Figure 18:
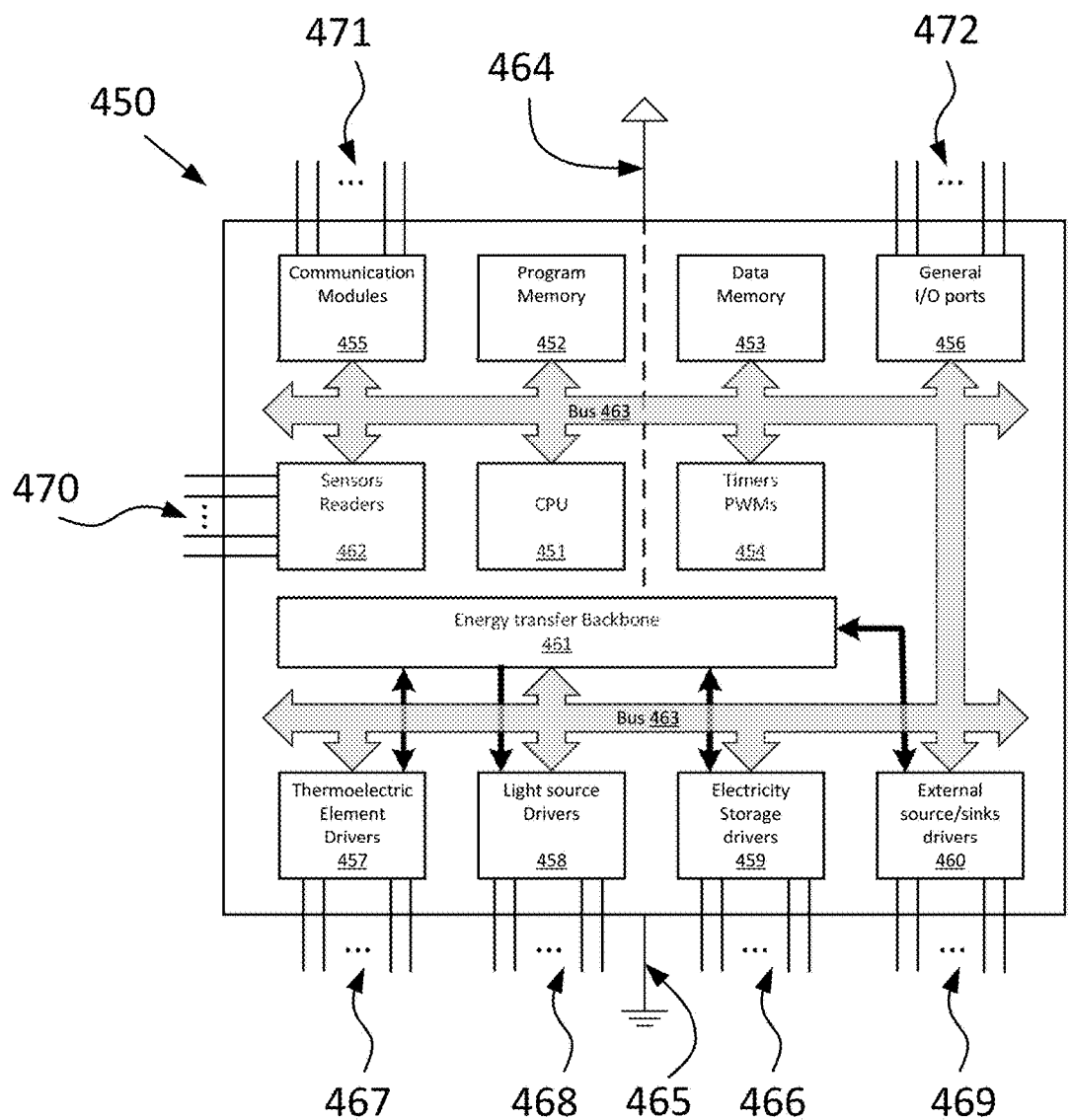
FIG. 18 is a block diagram of an integrated circuit implementing a significant portion of the thermal management system in accordance with the current invention.

Reference is now made to FIG. 18. FIG. 18 illustrates a block diagram of an integrated circuit, referred also as IC or chip or die, that implement significant portion of the thermal management system in accordance with the current invention. Chip 450 comprises blocks 451-462 and a plurality of contacts 963-973, referred also as pins or pads. Chip 450 contains both analog and digital circuits on the same chip. Chip 450 contains is composed of a plurality of layers. Some layers are made of semiconducting materials where various dopants are diffused into the substrate. Some other layers are made conductors (poly-silicon or metal layers), and some elements form the connections between the layers (via or contact layers). Chip 450 may be installed in the object to be thermally managed unpackaged or be packaged in variety of ways such as dual in-line package (DIP), pin grid array (PGA), leadless chip carrier (LCC), plastic quad flat pack (PQFP), thin small-outline package (TSOP), Ball grid array (BGA) and any other package. Chip 450 may be split to several dies that pack together in a Multi-Chip Module (MCM) package. The heart of chip 450 is a CPU block 451 that can run any program stored in a program memory 452. Program memory 452 may be programed once (ROM) or multiple time using memory types such as EPROM or Flash. Program memory 452 may also be RAM that is loaded from external communication means before execution, i.e., thermal management operation, starts. In addition, chip 450 has data memory 453. In order to perform all tasks involve firm timing, chip 450 comprises timers and PWMs block 454. Chip 450 may communicate with external computers and information resources using communication modules block 455. Communication module may support wired or wireless communication. Wired communication may include USB, FireWire, Ethernet, RS-232, CAN bus, SATA or the like. Wireless communication mat include WiFi, ZigBee, Bluetooth, Cellular standards like (3G, 4G, LTE, etc.), NFC, RFID and the like. Chip 450 further comprises general I/O ports 456 that are similar to I/O ports exists in general purpose microcontroller chips. Chip 450 further comprises six blocks that are specifically designed to support the implementation of a thermal management system in accordance with the present invention. Thermoelectric element drivers block 457 enable programmable loading and supplying for a plurality of thermoelectric elements. Light source driver block 458 support for driving one or more light emitting sources. Optionally, electric storage driver blocks 459 are integrated into chip 950 to support charge and discharge of one or more electric storage elements such as rechargeable batteries, capacitors or super capacitors. Block 460 support electric energy supply or delivery through one or more electric conductive ports, e.g., wires and connectors. All the energy sources and sinks that are involved in the thermal management operation are connected together to energy transfer backbone block 461. Energy transfer backbone block 461 route the energy between all energy sources and energy sinks. To provide good thermal management the state of the object and environment must be known to CPU 451. The relevant information may come from the communication models 455 or the General I/O ports or internal sensors integrated into blocks 457-460. Optionally, sensor reader block 462 is integrated into chip 450 to support reading of dedicated sensors, such as, temperature sensors, pressure sensors and other object or environment state sensors. Sensor reader block 462 may include circuitry such as differential amplifiers, sample and hold circuits and analog to digital convertors. Blocks 452-462 are connected to the CPU through a central bus 463. Optionally, other internal bus architectures known in microprocessors design are used.

The number of pads in chip 450 may varies from around dozen, for supporting a small thermoelectric management system, to several hundred, for supporting large thermoelectric management system. The pads are partitioned to several groups. Chip 450 power supply may come from a pair of supply pads, pad 464 (VCC) and ground pad 465 (GND). Alternatively, the power supply for chip 450 come from the electricity storage elements connected to chip 450 via pads 466. Note that chip 450 may be operated with ground reference so all other pads input or outputs may be referenced and driven with respect to ground or float operation where no common ground for the system exists. Thermoelectric elements are connected to chip 450 using pads 467. Typically, a significant amount of the total chip pads are allocated for supporting plurality of thermoelectric elements. Number of thermoelectric elements may reach hundreds in large chips. Pads 468 are used for driving light emitting sources. Pads 469 are used to connection for external electrical power source or sinks. Typically they will be connected to a connector located on a boundary of the controlled object. Pads 470 are used to connect to sensors that are part of the thermal management system. Optionally, those pads support a bus communication topology like ICAN that can read plurality of sensors using single pad or a pair of pads. Pads 470 are connected internally to the wired communication modules from one side and to the proper communication connector depending on the type of protocol from the other side. Alternatively, pads 470 may be used to connect to an antenna or RF power amplifier in the case were wireless communication used. Pads 472 are general purpose I/O pins.

Additionally or alternatively pads 466-472 may be programmable, i.e., there are more available internal blocks then pads and by programming one may allocated pads to thermoelectric elements or pads for sensors or pads for light emitting sources or pad for electrical storage elements and so on in accordance with the actual elements that are deployed in the thermal management system and in accordance with the resources of elements and pads in chip 450.

In an exemplary embodiment of the invention, an integrated circuit for thermal management system comprising a semiconductor die; the die circuitry comprises: one or more thermoelectric element drivers 457; and one or more electrical energy sinks (e.g., 458, 459 and/or 460), wherein the one or more thermoelectric element drivers 457 are configured to receive electrical energy from thermoelectric elements, and to transfer the electrical energy to the one or more electrical energy sinks.

In an exemplary embodiment of the invention, an integrated circuit for thermal management system comprising a semiconductor die; the die circuitry comprises: one or more thermoelectric element drivers 457; and one or more electrical energy sources (e.g., 459 and/or 460), wherein the one or more thermoelectric element drivers 457 are configured to supply electrical energy to thermoelectric elements, wherein the electrical energy is transferred from the one or more electrical energy sources.

Additionally or optionally, the thermoelectric element drivers controls the mode of operation of the thermoelectric elements and wherein each thermoelectric element in any portion of time is configured to be in one of an electricity generation mode, a heat pumping mode, a heat flow blocking mode or a heat flow transferring mode.

In accordance with an exemplary embodiment of the present invention the controlled object may be industrial facility or chemical facility.

In accordance with another exemplary embodiment of the present invention the thermal management system may be integrated into wearing apparel, clothing, garment, dress and the like.

In accordance with yet another exemplary embodiment of the present invention the thermal management system may be integrated into fastening, connection or attachment fixtures or accessories of the controlled object such as screws, clamps, bolts, nuts and the like.

In accordance with yet another exemplary embodiment of the present invention the thermal management system may be integrated into casing of apparatus or vehicles or building.

In accordance with yet another exemplary embodiment of the present invention the light of the light emitting source may be modulated in order to convey information from the object. The information may comprise the state of the object such as its temperature, pressure, alignment and the like, or other information the thermal management system can provide. The modulation may be amplitude, phase or frequency modulation. Optionally or alternatively, the information is conveyed in the transmitted light wavelength.

In accordance with yet another exemplary embodiment of the present invention the wavelength of the light of the light emitting source may be set to disrupt or deceit IR imaging system that are based on black body temperature of an object.

In accordance with another exemplary embodiment of the present invention wavelength of the light emitted by the light emitting source is selected to provide an illusion that the object is in a different temperature than the object real temperature.

It is expected that during the life of a patent maturing from this application many relevant elements will be developed and the scope of the invention is intended to include all such new technologies a priori.

The terms "comprises", "comprising", "includes", "including", "having" and their conjugates mean "including but not limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A thermal management system for an object comprising:
   (a) one or more thermoelectric elements; and
   (b) one or more light emitting sources,
wherein a portion of the heat energy that is generated or absorbed by said object is converted by said thermoelectric elements to electrical energy, and the electrical energy is transferred to said light emitting sources which converts the electrical energy to light energy and emits the light energy to the environment, and wherein the emission of the light energy is configured to evacuate the heat energy from the object.

2. The thermal management system of claim 1 comprising a plurality of thermoelectric elements.

3. The thermal management system of claim 1 comprising a plurality of light emitting sources.

4. The thermal management system of claim 1 further comprises an electricity transport medium that transfer the electrical energy from the thermoelectric elements to the light emitting sources.

5. The thermal management system of claim 4, wherein the electricity transport medium comprises electrical circuits comprising one or more of or any combination of (1) a DC to DC convertor circuit, (2) a load matching circuit, (3) a load setting circuit, (4) an electrical switch, (5) a polarity setting circuit, (6) a supply setting circuit, and (7) an electrical energy storage circuit.

6. The thermal management system of claim 1, wherein the transfer of electrical energy is controlled by a controller.

7. The thermal management system of claim 6, wherein the controller controls the routing of electrical energy between the thermoelectric elements and the light emitting sources.

8. The thermal management system of claim 6, wherein the controller controls the mode of operation of the thermoelectric elements and wherein each thermoelectric element in any portion of time is configured to be in one of an electricity generation mode, a heat pumping mode, a heat flow blocking mode or a heat flow transferring mode.

9. The thermal management system of claim 1 further comprises electrical energy storage, wherein a portion of the electrical energy generated by the thermoelectric elements is transferred to the electrical energy storage and wherein a portion of the electrical energy stored in the electrical energy storage is transferred to the light emitting sources.

10. The thermal management system of claim 9, wherein the electrical energy storage comprises one or more of or any combination of (1) a battery, (2) a capacitor, and (3) a super capacitor.

11. The thermal management system of claim 9, wherein a minimal level of energy is stored in the electrical energy storage before electrical energy is transferred to the light emitting sources.

12. The thermal management system of claim 1 further comprises electrical energy storage, wherein a portion of the electrical energy generated by some of the thermoelectric elements that are working in an electricity generation mode is transferred to the electrical energy storage and wherein a portion of the electrical energy stored in the electrical energy storage is transferred to some other thermoelectric elements that are working in a heat pumping mode.

13. The thermal management system of claim 1, wherein the thermal management system is implemented in a fastening element of the object.

14. The thermal management system of claim 13, wherein the fastening element is a screw.

15. The thermal management system of claim 1, wherein the object is a cutting tool insert.

16. The thermal management system of claim 15, wherein the thermal management system is implemented in one of or any combination of (1) the cutting tool insert, (2) a seat of the cutting tool insert, (3) a tool holder of the cutting tool insert, and (4) a locking element of the cutting tool insert.

17. The thermal management system of claim 1, wherein the object is an injection mold.

18. The thermal management system of claim 1, wherein the object is a combustion engine.

19. The thermal management system of claim 1, wherein the light emitting source is a light emitting diode or a semiconductor laser.

20. The thermal management system of claim 1 further comprises one or more sensors, wherein the transfer of electrical energy is controlled conditioned upon the reading of the sensors.

21. The thermal management system of claim 1, wherein the wavelength of the light emitted by the light emitting source is selected to be different than the black body radiation wavelength emitted by the object due to actual object temperature to provide an illusion that the object is in a different temperature than the object real temperature.

22. The thermal management system of claim 1, wherein some of the thermoelectric elements are configured to be in an electricity generation mode and some others thermoelectric elements are configured to be in a heat pumping mode, and wherein a portion of the electrical energy generated by the thermoelectric elements in the electricity generation mode is transferred to the thermoelectric elements in the heat pumping mode.

23. The thermal management system of claim 1 further comprises one of or any combination of (1) an electrical energy storage, (2) an electricity transport medium, (3) a sensor, (4) an electric heater, (5) a light convertor, (6) an electrical power inlet, and (7) an electrical power outlet.

24. An apparatus comprising the thermal management system in claim 1.

25. The method of claim 24, wherein the transferring the electricity energy is performed by electrical circuits comprising one or more of or any combination of (1) a DC to DC convertor circuit, (2) a load matching circuit, (3) a load setting circuit, (4) an electrical switch, (4) a polarity setting circuit, (5) a supply setting circuit, and (6) an electrical energy storage circuit.

26. The method of claim 24 further comprises a step of storing electrical energy, wherein a portion of the electrical energy generated by the thermoelectric elements is transferred to the electrical energy storage and a step of supplying electrical energy wherein a portion of the stored electrical energy is transferred to the light emitting sources.

27. A method for thermal management of an object comprising:
generating electrical energy from heat energy that is generated or absorbed by said object using one or more thermoelectric elements;
transferring said generated electrical energy to one or more light emitting sources; and
emitting light energy by said one or more light emitting sources, wherein the emission of the light energy is configured to evacuate the heat energy from the ovject.

28. A capsule comprising:
a top surface;
a bottom surface;
a case in-between the top surface and the bottom surface;
one or more thermoelectric elements; and
one or more light emitting sources, wherein the capsule is designed to stably float over an area of an object comprising fluid in a way that the top surface is located over the fluid and the bottom surface is located under the fluid and using the difference between the temperature of the top surface and the bottom surface the thermoelectric elements is generating electrical energy and the electrical energy is transferred to the light emitting sources which convert the electrical energy to light energy and emits the light energy out of the capsule, wherein the emission of the light energy is configured to evacuate a heat energy from the object.

29. A thermal management system for an object comprising a plurality of capsules of claim 28 spread over areas of the object comprising fluids.

* * * * *